(12) United States Patent
Morimoto

(10) Patent No.: US 6,504,198 B2
(45) Date of Patent: Jan. 7, 2003

(54) HORIZONTAL TYPE FERROELECTRIC MEMORY AND MANUFACTURING METHOD OF THE SAME

(75) Inventor: Toyota Morimoto, Sagamihara (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/816,478

(22) Filed: Mar. 26, 2001

(65) Prior Publication Data

US 2001/0048624 A1 Dec. 6, 2001

(30) Foreign Application Priority Data

Mar. 27, 2000 (JP) ......................................... 2000-087402

(51) Int. Cl.⁷ .......................... H01L 29/76; H01L 29/94; H01L 31/062; H01L 31/113; H01L 31/119
(52) U.S. Cl. .......................... 257/295; 257/296; 257/303
(58) Field of Search .................................. 257/295, 303, 257/306, 296; 438/3, 240, 241, 239, 253, 396

(56) References Cited

U.S. PATENT DOCUMENTS

| | | | |
|---|---|---|---|
| 5,576,928 A | * 11/1996 | Summerfelt et al. | ..... 361/321.1 |
| 5,903,492 A | 5/1999 | Takashima | .................... 365/145 |
| 6,033,919 A | * 3/2000 | Gnade et al. | .................... 438/3 |
| 6,094,370 A | 7/2000 | Takashima | .................... 365/145 |
| 6,124,164 A | * 9/2000 | Al-Shareef et al. | ......... 438/240 |

* cited by examiner

Primary Examiner—Olik Chaudhuri
Assistant Examiner—Hoai Pham
(74) Attorney, Agent, or Firm—Oblon, Spivak, McClelland, Maier & Neustadt, P.C.

(57) ABSTRACT

A ferroelectric capacitor is horizontally disposed, in which opposite surfaces of a pair of capacitor electrodes are disposed along the surface of a semiconductor substrate, and an oxidative diffusion barrier film is formed on an upper end of the contact plug having a lower end connected to the diffusion region of a memory cell transistor during the manufacturing steps, after which under the condition where a top end of the contact plug is covered by the oxidative diffusion barrier film, a high-temperature annealing is performed so as to restore any damage applied to the ferroelectric capacitor that may be caused during the manufacturing steps thereof, followed by the removing step of the oxidative diffusion barrier film existing on the surface of the contact plug, and then followed by a forming step of a metallic wiring to obtain a ferroelectric memory product.

29 Claims, 18 Drawing Sheets

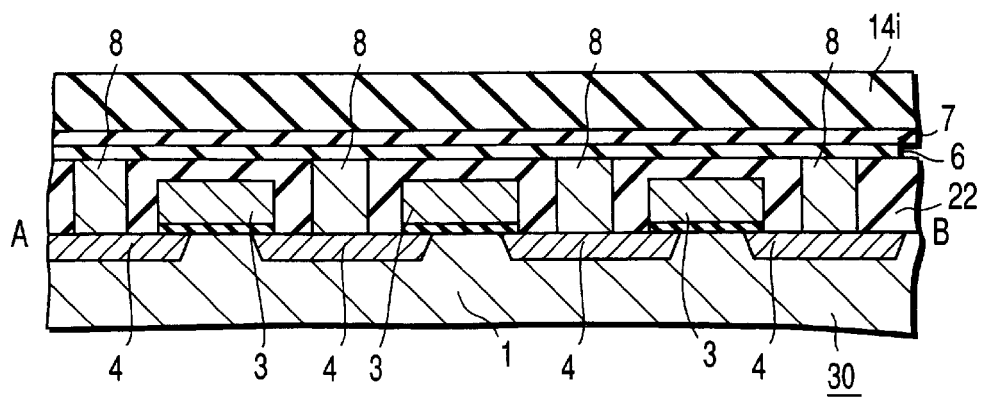
F I G. 7A
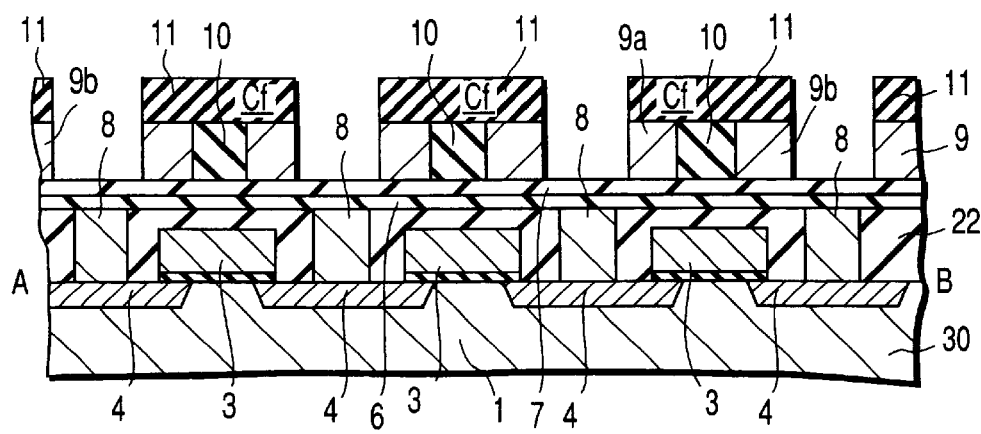
F I G. 7B
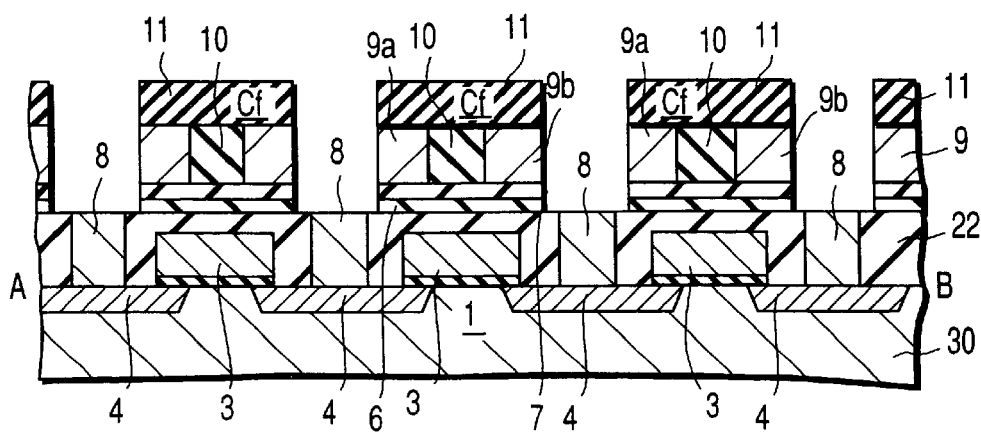
F I G. 7C

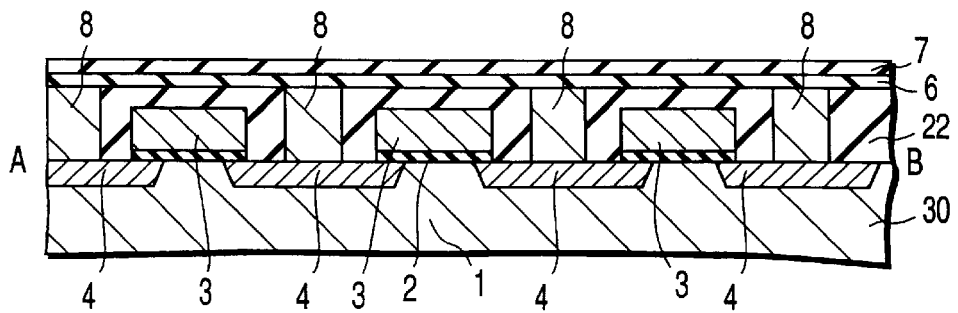
F I G. 16A
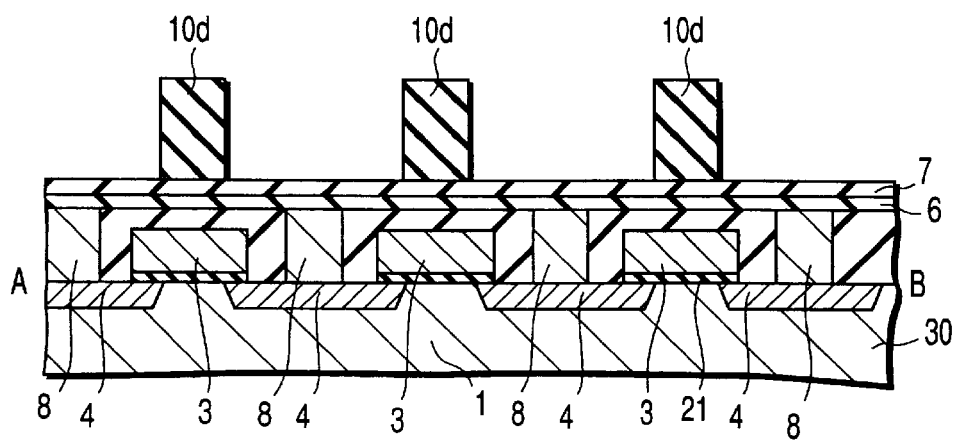
F I G. 16B
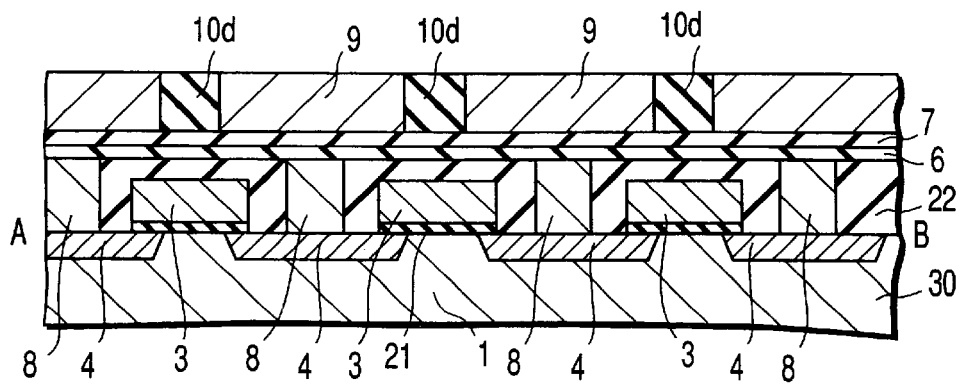
F I G. 16C

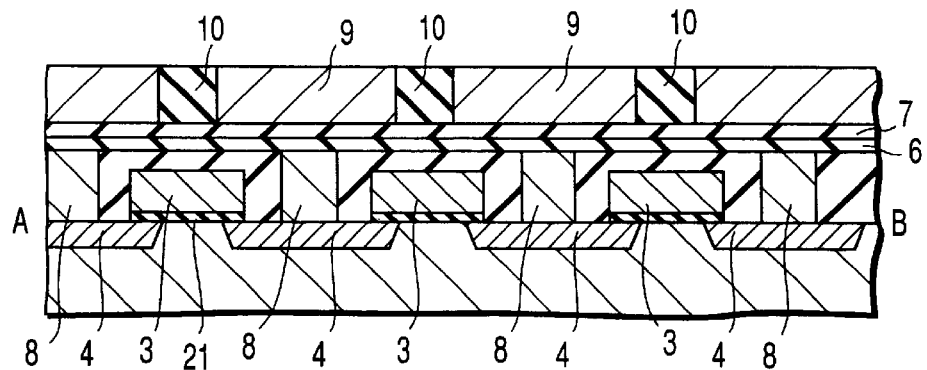
F I G. 17
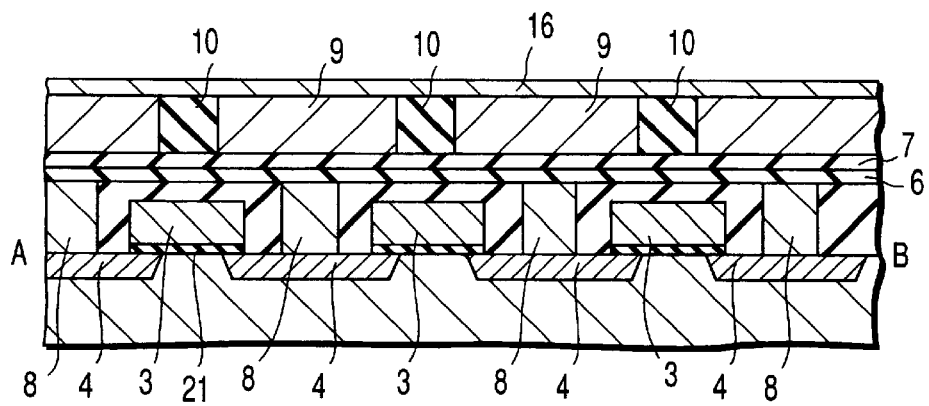
F I G. 18
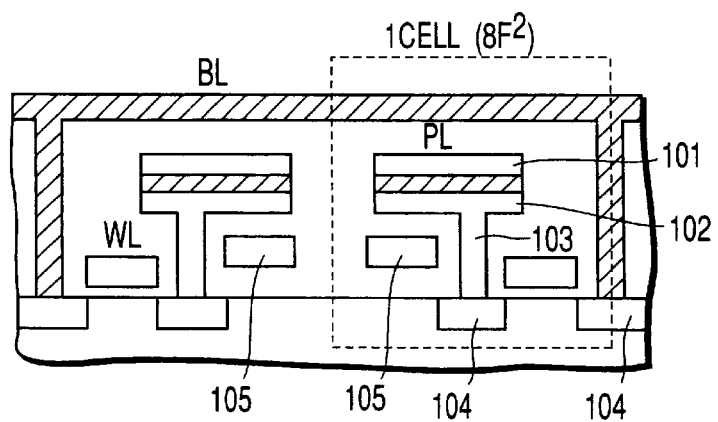
F I G. 19A PRIOR ARRT

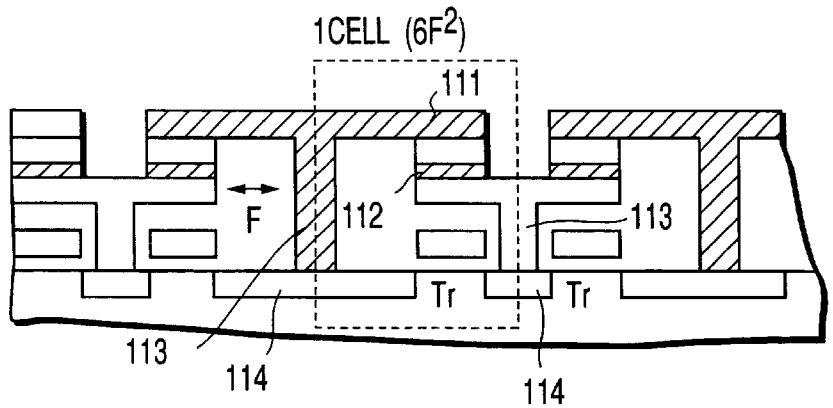
FIG. 19B PRIOR ARRT
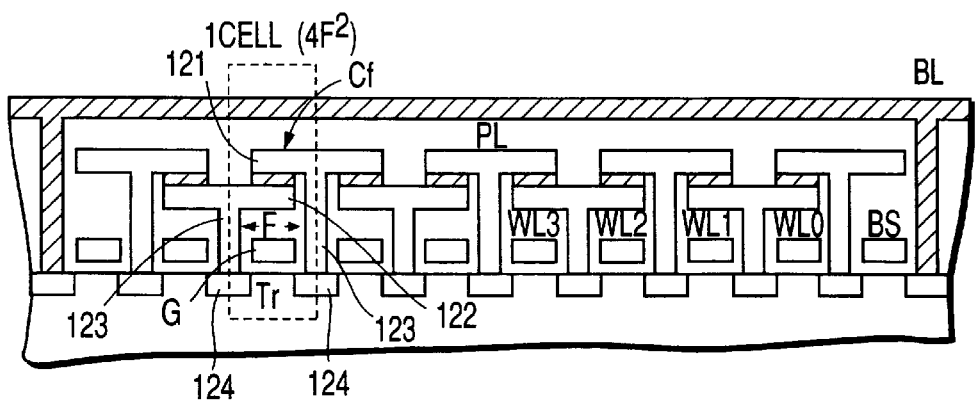
FIG. 19C PRIOR ARRT
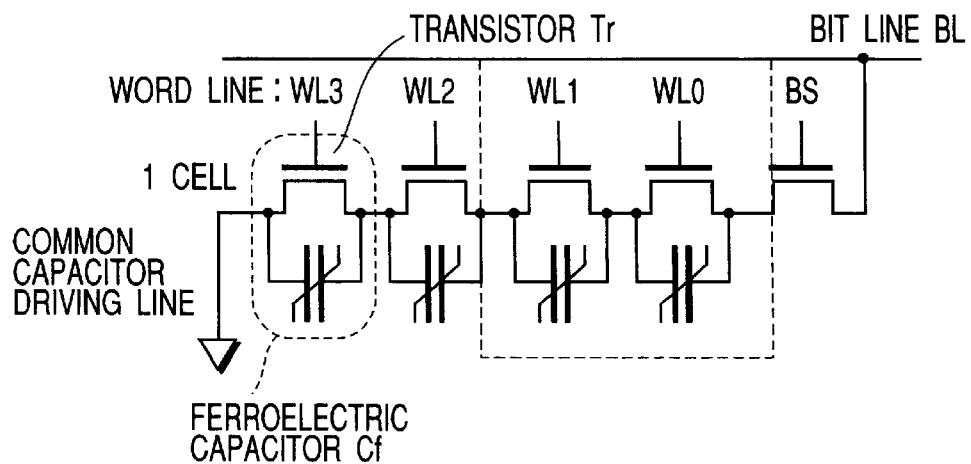
FIG. 20 PRIOR ARRT

HORIZONTAL TYPE FERROELECTRIC MEMORY AND MANUFACTURING METHOD OF THE SAME

CROSS-REFERENCE TO RELATED APPLICATIONS

This application is based upon and claims the benefit of priority from the prior Japanese Patent Application No. 2000-087402, filed Mar. 27, 2000, the entire contents of which are incorporated herein by reference.

BACKGROUND OF THE INVENTION

This invention relates to a ferroelectric memory, and in particular, to a ferroelectric memory device which includes series connected memory cells each having a transistor (T) having a source terminal and a drain terminal and a ferroelectric capacitor (C) connected between the source and drain terminals, and which is hereafter named as a "series connected TC unit type ferroelectric RAM".

Since the ferroelectric memory is capable of rewriting data stored therein in spite of the nonvolatile characteristics thereof, it is increasingly widely employed for various end-uses. However, for the purpose of further expanding the end-use thereof, it is still indispensable to minimize the structure thereof in addition to the increase of the memory capacity thereof. As for the miniaturization of the cell size of the ferroelectric memory, there have been proposed various structures such as a COP structure and the series connected TC unit type ferroelectric RAM architecture (refer to D. Takashima et al., ISSCC, February, 1999).

As shown in FIG. 19A, for example, in the case of the ferroelectric RAM of the conventional structure where neither the COP structure nor the series connected TC unit type ferroelectric RAM architecture is adopted, not only a contact region 103 to be connected to an upper electrode 101 or a lower electrode 102 of the capacitor, but also a connecting wiring 105 to be connected to a diffusion layer 104 are necessary. Moreover, a predetermined space is required between a contact hole of the contact region 103 and the connecting wiring 105, and at the same time, a large number of connecting wirings 105 and hence a large number of spaces for the connecting wirings 105 are required to be provided, so that the area required to be allocated to the layout of each cell would become large inevitably. For example, when the minimum dimension to be employed in designing the ferroelectric RAM is defined as F, the cell size of FIG. 19A would become $8F^2$.

One of the methods which are capable of minimizing the area required for the layout of each cell is the aforementioned series connected TC unit type ferroelectric RAM architecture, the structure of which is illustrated in FIG. 19B. This cell is formed to have a size $6F^2$ wherein the upper electrode 111 of the capacitor is commonly used by a couple of neighboring cells, and two lower electrodes 112 of a couple of neighboring cells are provided to the common upper electrode 111. Each of these electrodes 111 and 112 is connected via a contact 113 with a diffusion layer 114. Further, this diffusion layer 114 is also commonly used by a couple of neighboring transistors Tr.

When these cells constructed as shown in FIGS. 19A and 19B, respectively, are compared with each other with respect to the chip area thereof, assuming that these cells are manufactured based on the same design rule, it will be found that it is possible, through the employment of the series connected TC unit type ferroelectric RAM architecture shown in FIG. 19B, to reduce the area of cell to about 60% of the cell of FIG. 19A in the case of 4M-ferroelectric RAM. Realistically however, it seems to be difficult, according to the architecture of the series connected TC unit type ferroelectric RAM shown in FIG. 19B, to expect any further substantial miniaturization of the cell.

With a view to overcome this limitation in the miniaturization of the cell size and to realize a further-increased miniaturization of the cell, a series connected TC unit type ferroelectric RAM architecture having a structure as shown in FIG. 19C has been proposed. This ferroelectric RAM architecture having such a structure can be represented by an equivalent circuit as shown in FIG. 20. In the structure shown in FIG. 19C, diffusion regions 124 to be employed respectively as a source and a drain with a gate electrode G of one memory cell transistor Tr being interposed therebetween are connected via contact plugs 123 with the upper electrode 121 and lower electrode 122 of a capacitor Cf, respectively.

Each of these diffusion regions 124 is commonly used as the source and drain of transistors of the neighboring cells, thereby constituting an architecture connected with each other in the form of a chain. In this case, the COP structure is applied to both upper and lower electrodes 121 and 122, thereby suggesting the possibility of obtaining, under ideal conditions, a most miniaturized cell size of $4F^2$ as shown in FIG. 19C.

This structure shown in FIG. 19C accompanies with many difficulties before it can be actually realized. For example, when tungsten which is vulnerable to oxidation is employed for the fabrication of contact plug 123, it is required to develop a barrier film which is capable of sufficiently electrically connected with tungsten of the contact plug 123 as well as with the lower electrode 122, and also capable of preventing the oxidation of the tungsten after the fabrication of contact plug 123. Furthermore, there is another problem that the upper limit of the process temperature is determined depending on the barrier properties of the barrier film. Therefore, it is very difficult at present to combine the structure of FIG. 19C with the employment of a barrier film of SBT whose film-forming temperature is 700° C. or more.

Further, even if it is possible to apply the COP structure to the lower electrode 122, it is unavoidable, in order to apply the COP structure also to the upper electrode 121 for the purpose of obtaining an ideal structure as shown in FIG. 19C, to increase the number of steps and also to increase the number of burying steps, thereby making the entire process very complicated. In particular, it becomes difficult to secure desired properties of the ferroelectric capacitor Cf. Because of these reasons, the process integration for this cell structure can be only realized with such a great sacrifice as mentioned above.

As explained above, it is required, for the realization of a cell having $4F^2$ structure which enables to miniaturize the series connected TC unit type ferroelectric RAM architecture as shown in FIG. 19C, to adopt a construction where both upper and lower electrodes are constituted by the COP structure, i.e. a structure where the electrodes are taken up from the beneath or underside of the ferroelectric capacitor Cf. Therefore, both upper and lower electrodes 121 and 122 necessitate the provision of a conductive barrier film. However, no one has succeeded as yet to find out such an excellent barrier film that is capable of withstanding the restoring (recovery) annealing temperature with a sufficient margin.

Thus, various technical developments such as an improved low damage working process, a low damage insulation deposition technique, a short time damage restoring technique, a technique of protecting electrodes from damaging, etc. are required.

Therefore, an object of this invention is to provide a ferroelectric memory which enables to realize the miniaturization of the cell, which can be manufactured by a simple manufacturing process, and which is stable in characteristics.

Another object of this invention is to provide a method of manufacturing such a ferroelectric memory as described above.

BRIEF SUMMARY OF THE INVENTION

This invention provides a ferroelectric memory wherein a horizontal type ferroelectric capacitor is disposed immediately above a memory cell transistor, in which a pair of capacitor electrodes having a ferroelectric layer sandwiched therebetween are arranged horizontally in a direction along with a surface of a semiconductor substrate. In particular, this invention provides a ferroelectric memory which is capable of realizing an extremely miniaturized cell size without necessitating a conductive barrier film which has been deemed as being indispensable in the prior art. This invention also provides a method of manufacturing a ferroelectric memory having these desired features.

Namely, according to this invention, a ferroelectric capacitor is horizontally disposed along with the surface of the semiconductor substrate, so that the pair of electrodes, arranged in the horizontal direction to face to each other, of the ferroelectric capacitor can be simultaneously formed in a manufacturing step, thereby making it possible to reduce the number of manufacturing steps and at the same time, to homogenize the properties of the electrodes. In a conventional structure, since the lower and upper electrodes of the ferroelectric capacitor are stacked vertically in a direction normal to the surface of the semiconductor substrate, the lower and upper electrodes should be formed in different steps.

Further, according to this invention, not the conductive barrier film which is rather limited in tolerance on the occasion of heat treatment thereof, but an insulating barrier film is employed as a barrier film to be formed on a contact plug. After the formation of a capacitor, a restoring annealing is performed, which is followed by a step of forming a wiring layer connected with neighboring cells and also with contact plugs formed on a diffusion region. Thus, according to the present invention, it is possible to simultaneously form a pair of electrodes of the capacitor and also to perform the connection between neighboring cells as well as the connection with the cell transistor all at once by making use of a single metallic wiring. Therefore, it is possible to reduce the number of manufacturing steps and at the same time, to homogenize and stabilize the properties of the capacitors.

More specifically, the ferroelectric memory according to one aspect of this invention is featured in that it comprises;
an MOS transistor formed on a semiconductor substrate;
a ferroelectric capacitor horizontally disposed over the MOS transistor in a channel length direction of the MOS transistor;
contact plugs connected with the gate and source/drain regions of the MOS transistor, respectively; and
metallic wirings respectively formed on and connected with contact plugs which are connected with the source/drain regions, the metallic wirings respectively having a sidewall which is contacted with the electrodes of the ferroelectric capacitor.

Further, the present invention also provides a method of manufacturing a ferroelectric memory, which comprises;
forming a plurality of MOS transistors on a surface of a semiconductor substrate;
forming a first insulating film covering each of the MOS transistors;
forming contact plugs in contact regions of the insulating film, the contacting regions corresponding with source/drain and gate of the MOS transistors;
forming a ferroelectric capacitor in such a manner that the electrodes and ferroelectric film are horizontally disposed on a surface of the insulating film which corresponds to where the MOS transistor is located;
performing an annealing for restoring any damage resulted from the step of forming the ferroelectric capacitor; and
forming metallic wirings on surface portions of the contact plugs which are located between neighboring electrodes of a pair of neighboring ferroelectric capacitors to thereby simultaneously achieve an electric connection between the neighboring electrodes and with the source/drain of the MOS transistor.

Due to the employment of these structure and method described above, a pair of electrodes of the ferroelectric capacitor can be simultaneously formed, thereby making it possible to reduce the number of manufacturing steps and also to expand the facing area of the ferroelectric capacitor not only in the horizontal direction but also in the vertical direction of the semiconductor substrate, and hence the chip size can be miniaturized inversely proportion to the magnitude of this expansion.

Additionally, since an insulating barrier film is formed between a memory cell transistor and a ferroelectric capacitor according to one embodiment of this invention, the process margin or tolerance can be increased, and at the same time, it becomes possible to carry out a sufficient heat treatment for restoring any damage to the ferroelectric capacitor which would be inevitably caused during the manufacture of a ferroelectric memory, thus making it possible to manufacture a ferroelectric memory having excellent properties.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIGS. 7A to 7C show respectively a cross-sectional view for illustrating the manufacturing method of the ferroelectric memory shown in FIGS. 6A to 6C;

FIGS. 16A to 16C show respectively a cross-sectional view for illustrating the manufacturing method of the ferroelectric memory shown in FIGS. 6A to 6C or in FIGS. 12A to 12C;

FIG. 17 shows a cross-sectional view for illustrating the manufacturing method of the ferroelectric memory shown in FIGS. 6A to 6C or in FIGS. 12A to 12C;

FIG. 18 shows a top plan view of a ferroelectric memory illustrating a sixth embodiment of this invention;

FIGS. 19A to 19C show respectively a cross-sectional view for illustrating various examples of ferroelectric memory according to the prior art; and FIG. 20 illustrates the structure of the circuit of a series connected TC unit type ferroelectric RAM according to the prior art.

DETAILED DESCRIPTION OF THE INVENTION

Now, various embodiments of this invention will be explained with reference to drawings.

Figure 1A:
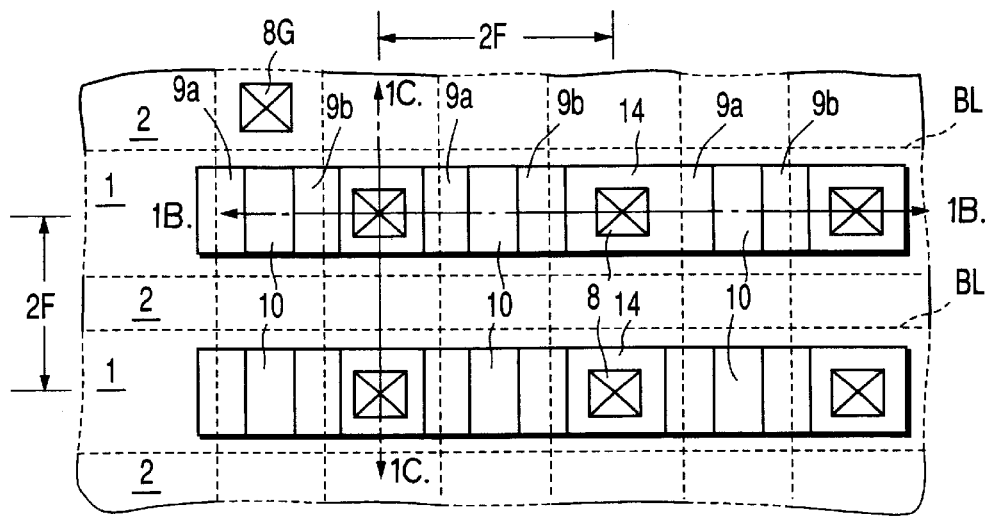
FIG. 1A shows a top plan view of a ferroelectric memory illustrating one embodiment of this invention.
Figure 1B:
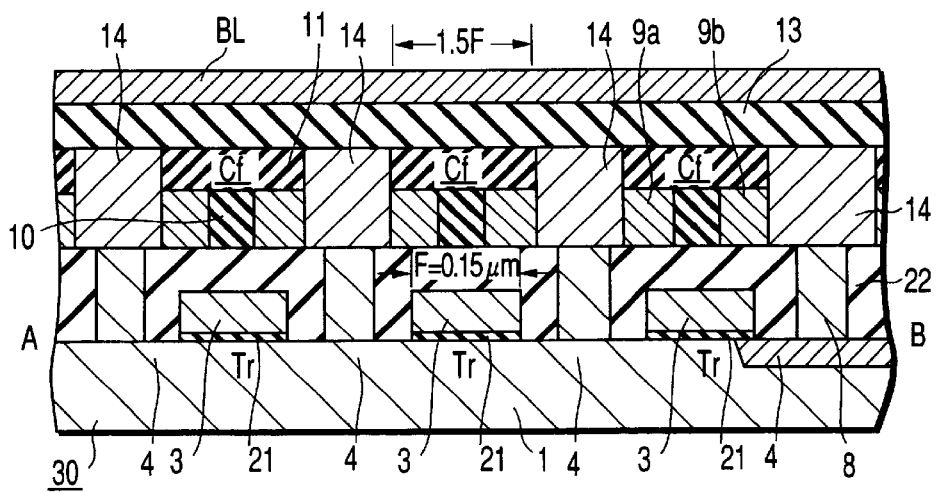
FIGS. 1B and 1C show respectively a cross-sectional view of the ferroelectric memory shown in FIG. 1A.
Figure 1C:
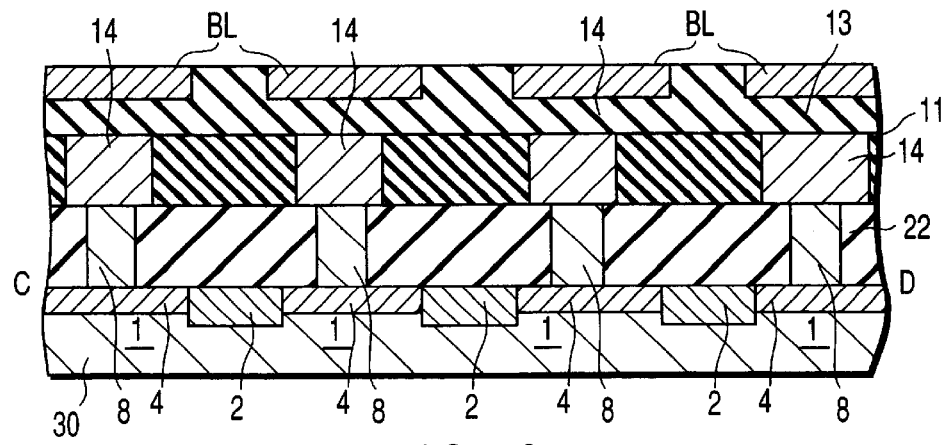

FIGS. 1A to 1C show the structure of a series connected TC unit type ferroelectric RAM representing a first embodiment of this invention. Specifically, FIG. 1A shows a plan view; FIG. 1B is a cross-sectional view taken along the line A-B of FIG. 1A; and FIG. 1C is a cross-sectional view taken along the line C-D of FIG. 1A.

Referring to FIGS. 1A to 1C, a plurality of buried element isolation regions 2 are formed in a stripe pattern on the surface of a semiconductor substrate 30, and a plurality of element regions 1 are defined between these element isolation regions 2.

In each element region 1, a diffusion layer 4 is formed in a self-alignment manner relative to the gate electrode 3 of each transistor Tr. The gate electrode 3 is formed on the surface of a gate insulating film 21 constituting a first insulating film, thereby constructing a plurality of MOS transistors Tr of one conductivity type. The MOS transistors Tr are covered by a second insulating film 22 which has a surface smoothed by means of a CMP method, for example.

A contact plug 8 is buried in the second insulating film 22 and contacted with the diffusion region or layer 4. By the way, another contact plugs are buried as gate contacts 8G for the gate electrode 3 at a region over the element isolation regions 2. These contact plugs can be formed using polycrystalline silicon doped with a high concentration of impurities or using tungsten (W).

A ferroelectric capacitor Cf comprising a successive array of a ferroelectric capacitor electrode 9a, a ferroelectric film 10 constituting a third insulating film, and another ferroelectric capacitor electrode 9b is formed immediately over each of the MOS transistors Tr with the second insulating film 22 being interposed therebetween. The ferroelectric capacitor Cf is horizontally disposed extending in the gate length direction of the gate of the transistor Tr. In other words, the ferroelectric capacitor electrodes 9a and 9b and the ferroelectric film 10 are arranged in a lateral direction along with a surface of the semiconductor substrate 30. Further, a fourth insulating film 11 is formed on the top of the ferroelectric capacitor Cf. A metallic wiring 14 is disposed on the top of the contact plug 8 which is contacted with the diffusion layer 4 of the transistor Tr. The both sides of the metallic wiring 14 are electrically connected with the right and left electrodes 9a and 9b of a pair of neighboring ferroelectric capacitors Cf neighboring the metallic wiring 14. Furthermore, an insulating film 13 is formed on the tops of the ferroelectric capacitor Cf and of the metallic wiring 14. On the top of this insulating film 13, a bit line BL is laterally formed along the element region 1.

Although not shown in the drawings, a passivation film is formed on the top of the bit line BL, thereby accomplishing a ferroelectric memory.

In the memory cell having a horizontal ferroelectric capacitor Cf constructed in this manner, the distance between a pair of contact plugs 8 in the direction along the element region 1 is 2F as shown in FIG. 1A, and hence, the dimension in the direction crossing the element region 1 is also 2F. Therefore, the area of a single memory cell would become 4F$^2$, thereby achieving an ultimate miniaturization.

In this embodiment, the horizontal ferroelectric capacitor Cf is formed between a pair of neighboring metallic wirings 14. In this case, the intervals between a pair of neighboring metallic wirings 14 is 1.5F for instance, as shown in FIG. 1B, so that a pair of capacitor electrodes 9a and 9b, and the ferroelectric film 10 are formed within this interval. By the way, although it is desirable that the dimension of this ferroelectric film 10 in thickness-wise direction of the substrate 30 is 2F or more, this dimension can be optionally determined depending on the capacity designed of the ferroelectric capacitor Cf.

As explained hereinafter, according to the embodiment shown in FIGS. 1A to 1C, both of the capacitor electrodes 9a and 9b of the ferroelectric capacitor Cf can be concurrently worked in one wiring layer in contrast to the prior art wherein capacitor electrodes of a capacitor should have been separately worked in the thickness direction of the semiconductor substrate. Therefore, it is possible according to this embodiment to reduce the number of manufacturing steps and also to inhibit the non-uniformity of the characteristics of these capacitor electrodes 9a and 9b.

Next, the manufacturing process of the ferroelectric memory having a structure as shown in FIGS. 1A to IC will be explained with reference to FIGS. 2A to 2C, FIGS. 3A to 3C, FIGS. 4A to 4C, and FIGS. 5A and 5B. By the way, the following explanations are made with reference to the cross-sectional view taken along the line A-B of FIG. 1A, or the cross-sectional view to be obtained by cutting the element region 1 in longitudinal direction thereof.

Figure 2A:
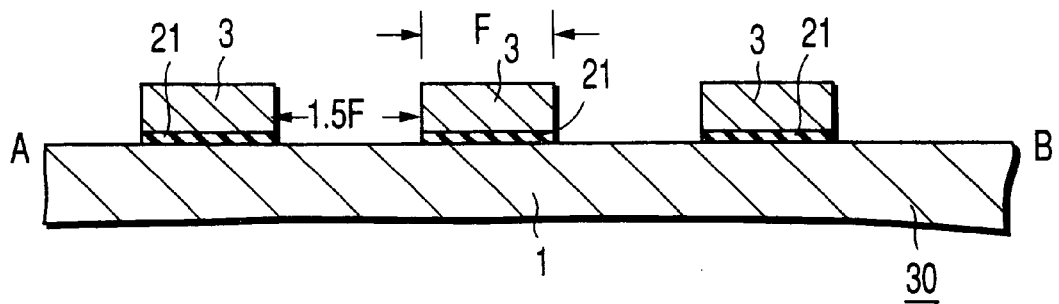
FIGS. 2A to 2C show respectively a cross-sectional view for illustrating the manufacturing method of the ferroelectric memory shown in FIGS. 1A to 1C.

FIG. 2A shows a state wherein a gate 3 is formed via a gate oxide film 21 on the surface of the element region 1, after the element region 1 has been formed between a pair of element isolation regions 2 which have been formed on the surface of n-type semiconductor substrate 30 as shown in FIGS. 1A and 1C. The distance between a pair of neighboring gates 3 in this case is 1.5F for instance, and the gate length of the gate 3 is set to F. As for the gate width, it is formed slightly narrower than the width of the element region 1 as shown in FIG. 1A.

Figure 2B:
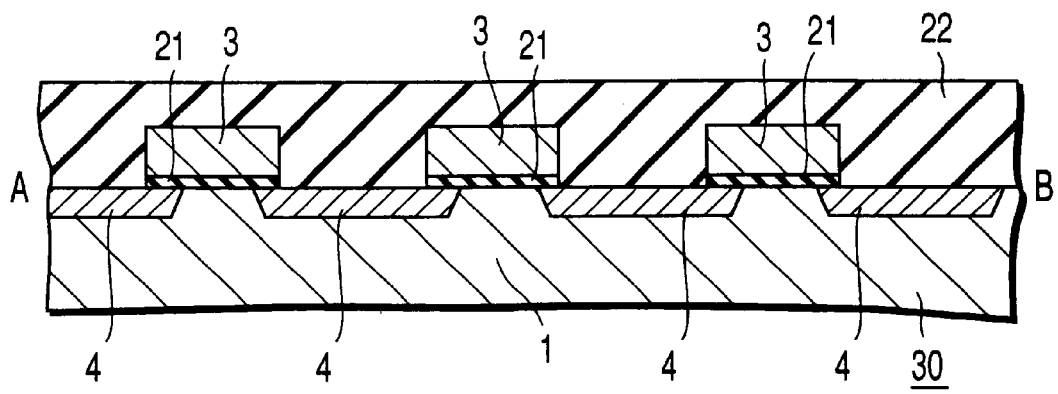

Then, as shown in FIG. 2B, a p-type diffusion layers 4 are formed in a self-alignment manner with the gate 3 being employed as a mask, after which an interlayer insulating film 22 is deposited thereon, the surface of the interlayer insulating film 22 thus deposited being subsequently flattened by means of a CMP method.

Figure 2C:
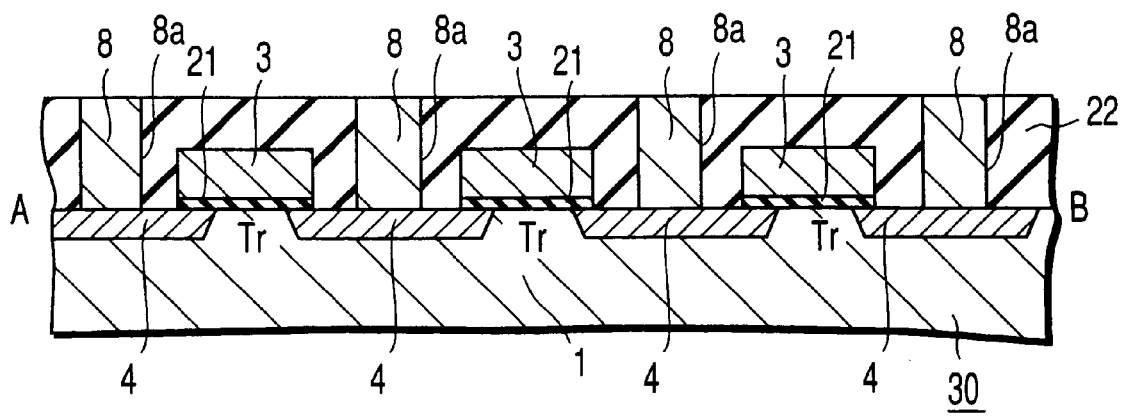

Thereafter, as shown in FIG. 2C, according to a lithography process, a resist is coated on the surface of the interlayer insulating film 22 and then subjected to an exposure treatment which is followed by a developing treatment, thereby forming a resist mask. Then, by making use of this resist mask, a contact hole 8a extending to the diffusion layer 4 is formed at an intermediate portion of the neighboring gates 3. Further, tungsten (W) as a material for the contact plug is deposited inside the contact hole 8a. The tungsten layer thus formed and the interlayer insulating film 22 are then shaped into a desired configuration by means of a CMP method to thereby form a contact plug 8. By the way, it is possible to employ, as a material for the contact plug, a doped polycrystalline silicon other than tungsten.

Figure 3A:
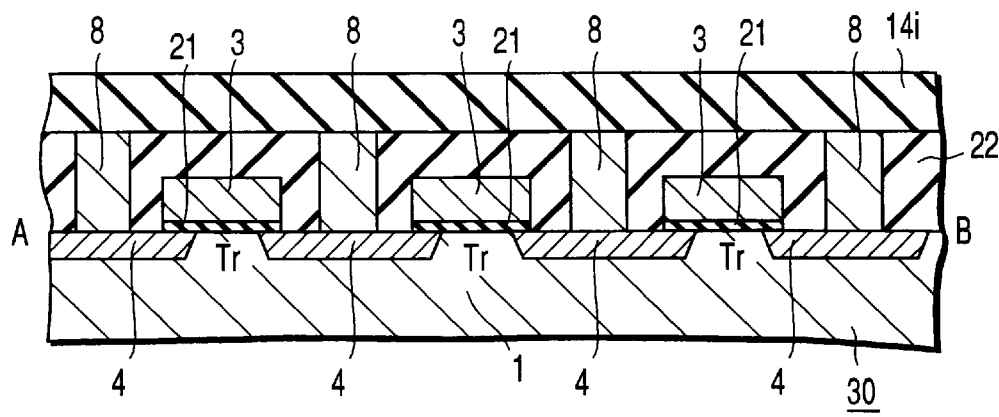
FIGS. 3A to 3C show respectively a cross-sectional view for illustrating the manufacturing method of the ferroelectric memory shown in FIGS. 1A to 1C.
Figure 3B:
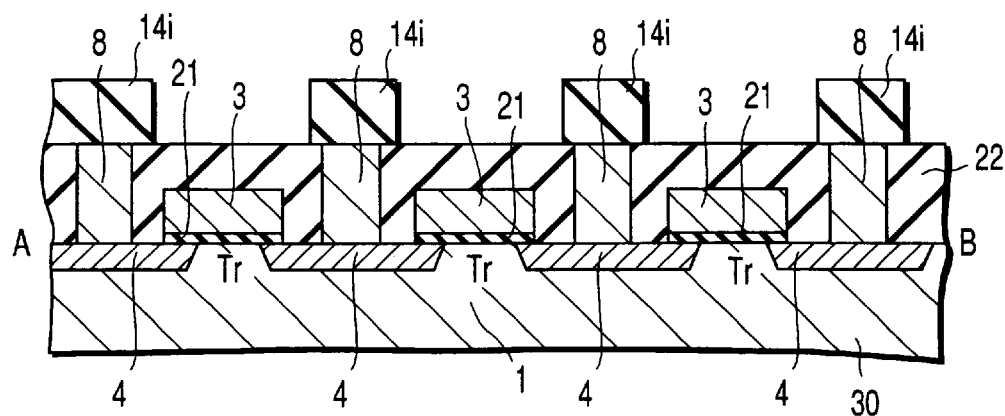

Next, as shown in FIG. 3A, an insulating film 14i is deposited all over the surface of the product of FIG. 2C. Then, as shown in FIG. 3B, the insulating film 14i is selectively etched away so as to leave the insulating film 14i partially only on the top portion of the contact plug 8. The width of the insulating film 14i which has been left as shown in FIG. 3B is formed larger than each contact plug 8 with a view to take into consideration any misalignment of the mask to be employed on the occasion of etching. Ideally however, it is preferable to form the left insulating film 14i at the same width as that of the contact plug 8.

Figure 3C:
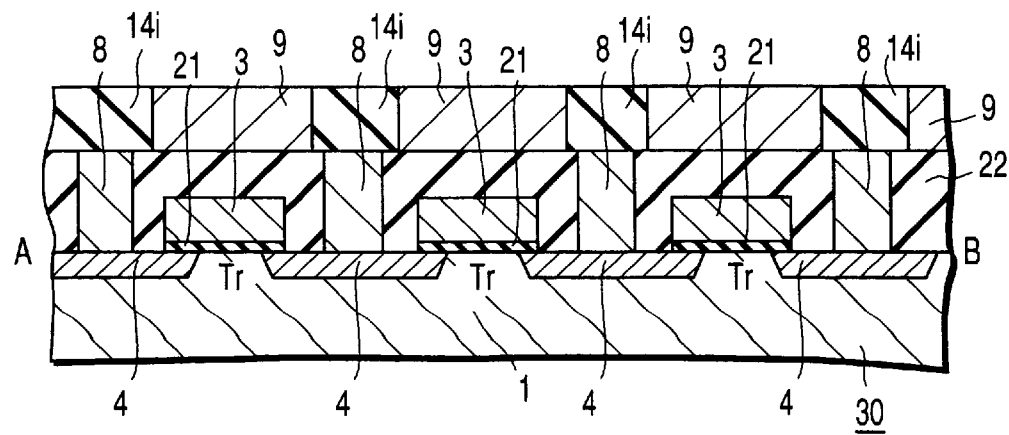

Next, as shown in FIG. 3C, an electrode film made of prutinum (Pt), for instance, is entirely deposited by means of a sputtering method, which is followed by a heat treatment and then by a flattening step by making use of a CMP method, thereby forming an electrode film 9 between each pair of the left insulating films 14i. By the way, the electrode film may be deposited after the formation of a stopper film on the top portion of the left insulating films 14i so as to prevent the left insulating films 14i from being badly affected by the material to be employed for the electrode film 9.

Figure 4A:
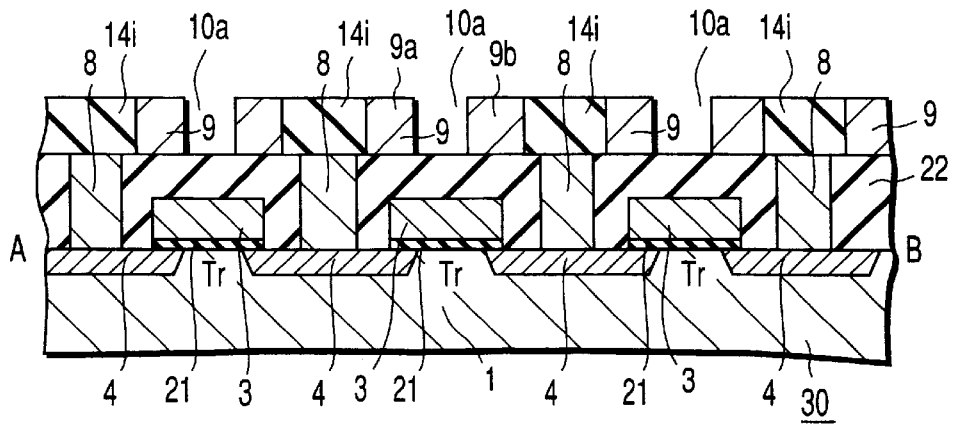
FIGS. 4A to 4C show respectively a cross-sectional view for illustrating the manufacturing method of the ferroelectric memory shown in FIGS. 1A to 1C.

Then, as shown in FIG. 4A, a cut region 10a for forming the ferroelectric film 10 shown in FIG. 1A is formed at a central portion of the electrode film 9 by means of etching. In this case, by means of a lithography process, all of the product surface except for the ferroelectric film-forming region 10a is covered by a resist mask. In this case, it is important to form the opening of the resist mask corresponding to this ferroelectric film-forming region 10a in such a manner that the opening extends over the region of the electrodes 9a and 9b. As a result, the ferroelectric capacitor electrodes 9a and 9b can be reliably insulated by the ferroelectric film 10 to be subsequently deposited between the electrodes 9a and 9b.

Figure 4B:
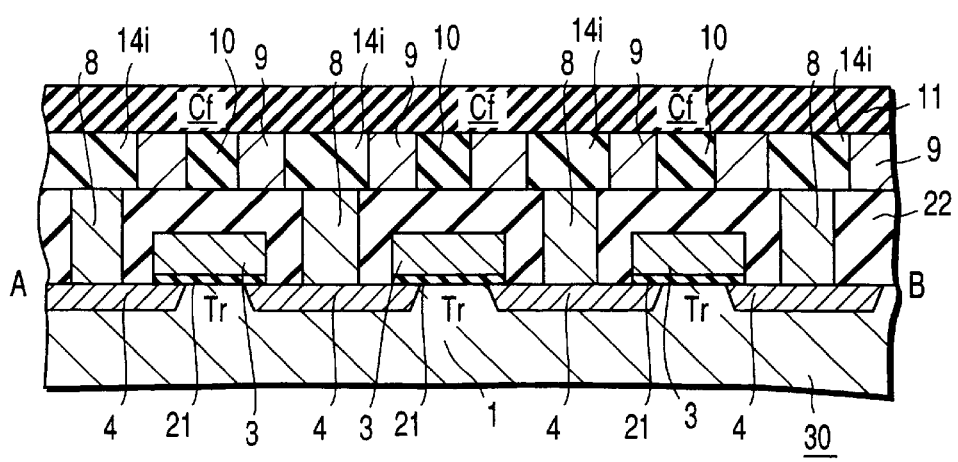

Then, as shown in FIG. 4B, the ferroelectric material is deposited all over the surface including the ferroelectric film-forming region 10a by means of a spin-coating method which enables to obtain a homogenous film followed by a CMP method to leave the ferroelectric material in the forming region 10a to form a ferroelectric film 10. Then, an insulating film 11 is entirely deposited. Thereafter, the surface of the insulating film 11 is flattened by means of the CMP method, thereby obtaining a ferroelectric capacitor Cf.

Figure 4C:
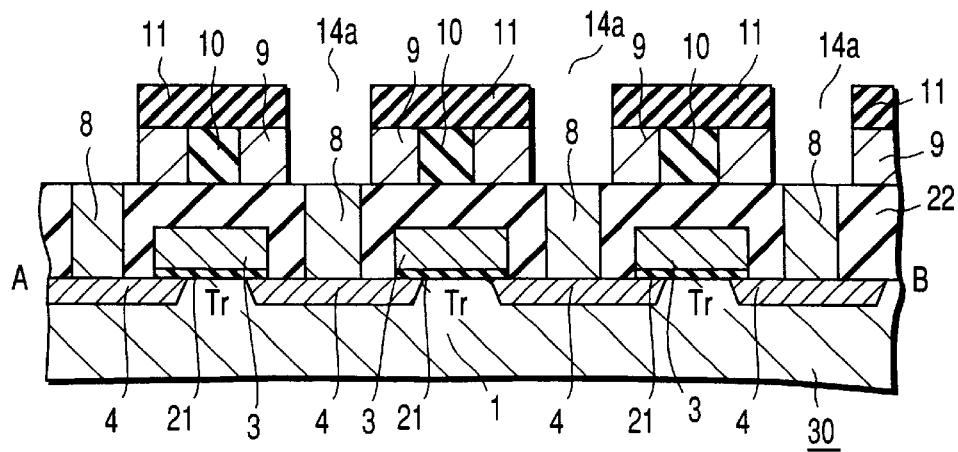

Then, as shown in FIG. 4C, the left insulating films 14i that has been formed in advance is etched away together with corresponding portions of the insulating film 11 to form an opening 14a to thereby allow the surface of the contact plug 8 to expose from the bottom of the opening 14a and the side surfaces of the capacitor electrodes 9a and 9b to expose to the opening 14a. Subsequently, the resultant structure is subjected to an oxygen annealing at a temperature of 600° C. to 700° C. so as to sufficiently restore or recover any damage to the ferroelectric film 10 that may be brought about up to this step. If both of the insulating films 11 and 14i are formed of the same insulating material, this etching can be accomplished using only one step.

Figure 5A:
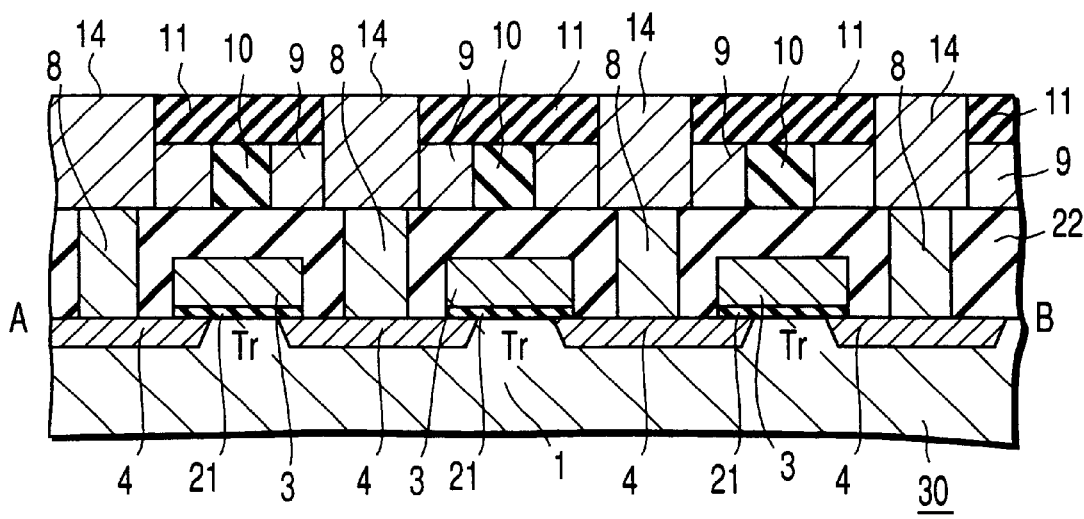
FIGS. 5A and 5B show respectively a cross-sectional view for illustrating the manufacturing method of the ferroelectric memory shown in FIGS. 1A to 1C.

Then, as shown in FIG. 5A, a conductive material is entirely deposited, and the surface thereof is flattened by making use of a CMP method so as to make it flush with the surface of the insulating film 11 until metallic wirings 14 are left in the openings 14a. It is possible in this case to further apply a heat treatment for effecting the reflow of the surface. In this way, the metallic wiring 14 can be formed only at the opening portions 14a, and at the same time, the connection thereof with both electrodes 9a and 9b of the ferroelectric capacitor Cf as well as the connection thereof with the contact plugs 8 can be concurrently achieved.

Finally, an insulating film 13 is entirely deposited, and the surface thereof is flattened by making use of a CMP method, after which a bit line BL is formed laterally on the resultant surface. Although not shown in the drawings, an ordinary passivation film is entirely formed on the resultant surface, thereby finishing the manufacturing process of the ferroelectric memory. By undergoing these steps, it is possible to obtain a miniaturized series connected TC unit type ferroelectric RAM having a horizontal ferroelectric capacitor Cf.

In this first embodiment mentioned above, a high-temperature annealing for restoring a damage to the ferroelectric film 10 is applied under the condition where the contact plug 8 is being exposed as shown in FIG. 4C. However, since the surface of the contact plug 8 exposed in this manner is vulnerable to oxidation, so that there is a possibility that a contact failure may be caused to occur between the contact plug 8 and the metallic wiring 14 to be subsequently formed thereon.

Therefore it is desirable to establish a more stable manufacturing process and structure of device. For this reason, it is desirable to form in advance an oxidative diffusion barrier film on the surface of the contact plug 8 for example, thereby making it possible to perform a high-temperature annealing before the surface of the contact plug 8 is allowed to expose. In the followings, the structure of ferroelectric memory and the manufacturing process thereof according to a second embodiment which is based on this idea will be explained with reference to FIGS. 6A to 6C and FIGS. 7A to 7C.

Figure 6A:
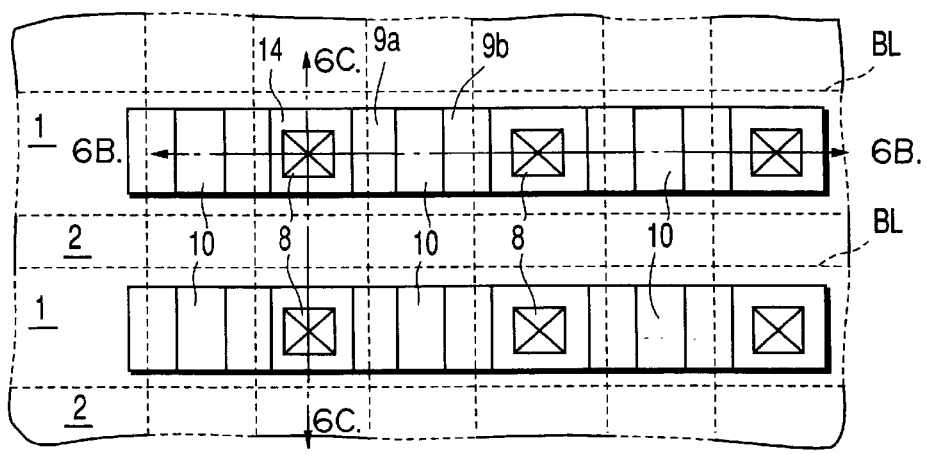
FIG. 6A shows a top plan view of a ferroelectric memory illustrating a second embodiment of this invention.
Figure 6B:
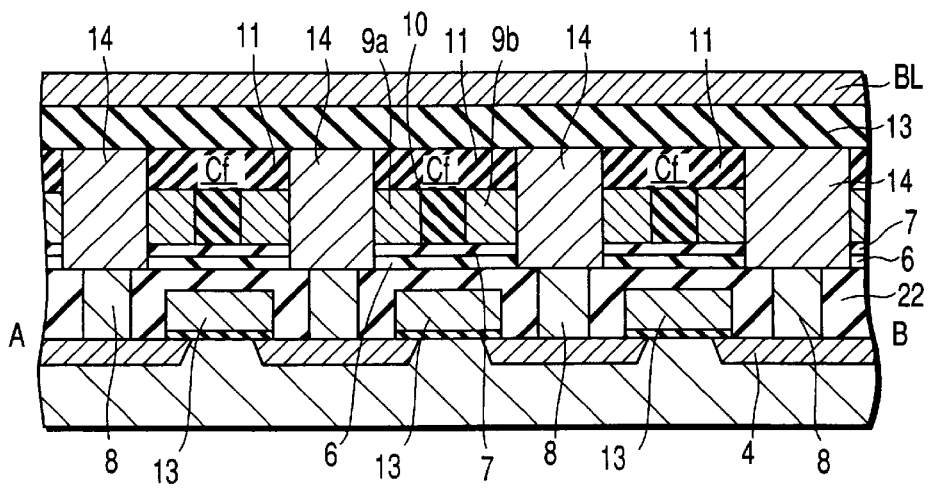
FIGS. 6B and 6C show respectively a cross-sectional view of the ferroelectric memory shown in FIG. 6A.
Figure 6C:
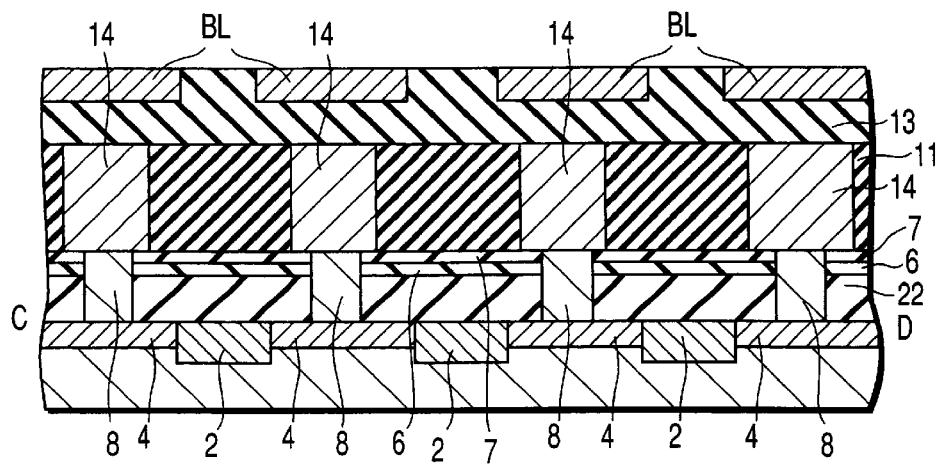

This second embodiment differs from the aforementioned first embodiment in the respect that as shown in FIGS. 6C and 6C, a laminate film consisting of a nitride film 6 and an oxide film 7 is interposed as an oxidative diffusion barrier film between an interlayer insulating film 22 and a ferroelectric capacitor Cf. Due to the existence of these oxidative diffusion barrier films 6 and 7, it becomes possible to completely inhibit the oxidation of the contact plug 8 as well as the diffusion of impurities into the transistor region 4 during the step of forming the ferroelectric capacitor Cf. For example, it has been confirmed that when the thickness of the nitride film 6 and the oxide film 7 is set respectively to 150 nm, it is possible to secure a sufficient barrier property even in a heat treatment in a furnace of 700° C. By the way, it is also possible to employ an oxynitride film containing a sufficient degree of nitrogen in place of these oxidative diffusion barrier films 6 and 7. In FIGS. 6A to 6C, other constituents are all the same as those of the embodiment illustrated in FIGS. 1A to 1C, so that these same constituents will be represented by the same reference numbers, thereby omitting a further explanation thereof.

Next, the manufacturing process of the embodiment shown in FIGS. 6A to 6C will be explained with reference to FIGS. 7A to 7C wherein only the manufacturing steps which differ from those of the first embodiment shown in FIGS. 1A to 1C will be explained to thereby avoid the duplication and complication of explanation.

In this second embodiment, as shown in FIG. 7A, after a contact plug 8 is buried at first in the interlayer insulating film 22 in a step corresponding to that shown in FIG. 2C, a nitride film 6 and then, an oxide film 7 are successively formed all over the resultant surface to a thickness of 150 nm, respectively.

Thereafter, an insulating film 14i is formed on the surface of this oxide film 7 in the same manner as shown in FIG. 3A. Thereafter, the same manufacturing process as illustrated as that of the first embodiment until the step of FIG. 4C is finished is repeated. In the same manner as explained in FIG. 4C, the etching is temporarily suspended under the condition where the insulating films 11 and 14i are etched away.

This condition is illustrated in FIG. 7B. Namely, when the oxide film 7 is exposed after the removal of the insulating films 11 and 14i by means of etching, the etching is suspended, wherein the surface of the contact plug 8 is covered by the films 6 and 7. Thereafter, an oxygen annealing is performed at a temperature of about 600° C. to 700° C. to thereby sufficiently restore a damage to the ferroelectric film 10 that has been brought about by the working performed up to this moment.

Figure 5B:
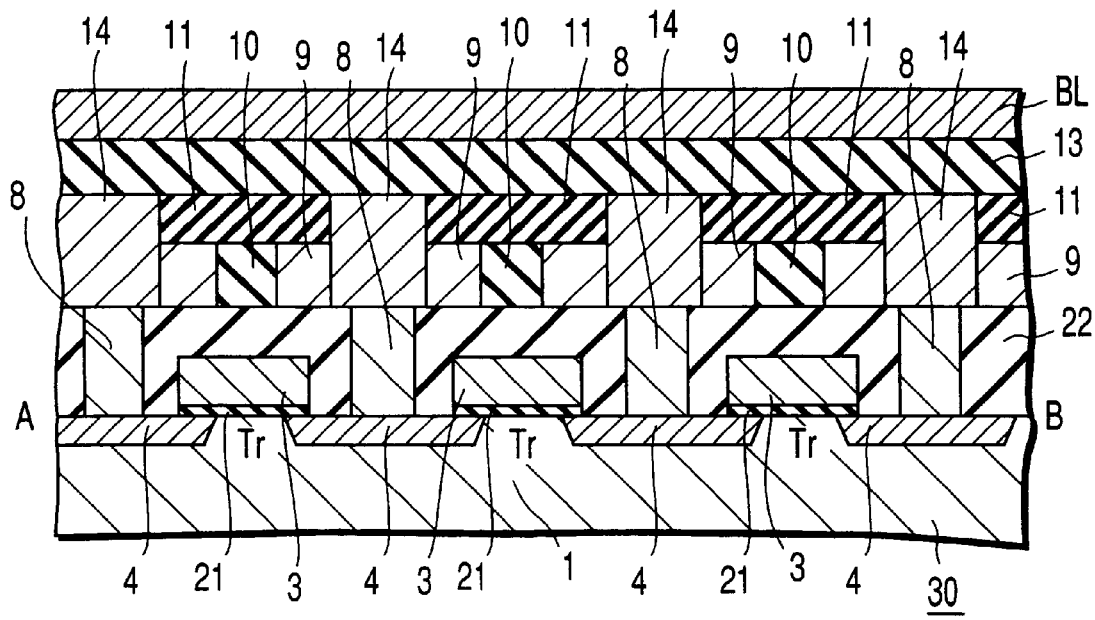

After finishing this step of restoring damage brought about by the working of the ferroelectric capacitor Cf by means of a high-temperature annealing as mentioned above, these oxidative diffusion barrier films 6 and 7 are then removed as shown in FIG. 7C, thereby allowing the contact plug 8 to expose. Thereafter, in the same manner as shown in FIGS. 5A and 5B, a metallic wiring 14 is formed, and a bit line BL is formed via an insulating film 13.

As explained above, according to the second embodiment, since the surface of the contact plug 8 is protected by these oxidative diffusion barrier films 6 and 7 until the moment immediately before the deposition of the metallic wiring 14, the annealing for restoring or recovering the ferroelectric capacitor Cf can be performed in an oxygen atmosphere at a sufficiently high temperature, thereby making it form an electrode film 9 in each space between the insulating films 14i. By the way, a conductive material may be deposited after the formation of a stopper film on the top portion of the insulating films 14i so as to prevent the insulating films 14i from being badly affected by the material to be employed for the electrode material 9.

Figure 10A:
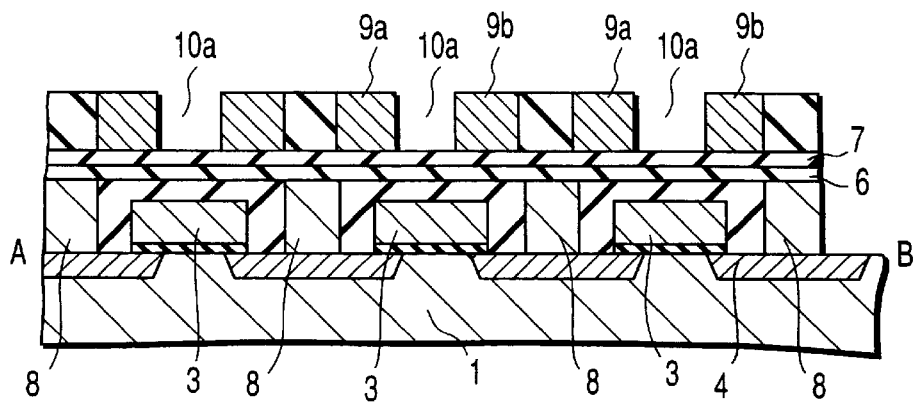
FIGS. 10A to 10C show respectively a cross-sectional view for illustrating the manufacturing method of the ferroelectric memory shown in FIGS. 8A to 8C.

Then, as shown in FIG. 10A, an opening region 10a for forming the ferroelectric film 10 is formed at a central portion of the electrode film 9 by means of etching. In this case, by means of a lithography process, all of the ferroelectric film 10 except for the ferroelectric film-forming region 10a is covered by a resist mask. In this case, it is important to form an opening for this ferroelectric film-forming opening region 10a in such a manner that the opening defined by the resist mask extends over the edges of the capacitor electrodes 9a and 9b. As a result, the ferroelectric capacitor electrodes 9a and 9b can be reliably insulated by the ferroelectric film 10 to be subsequently deposited.

Figure 10B:
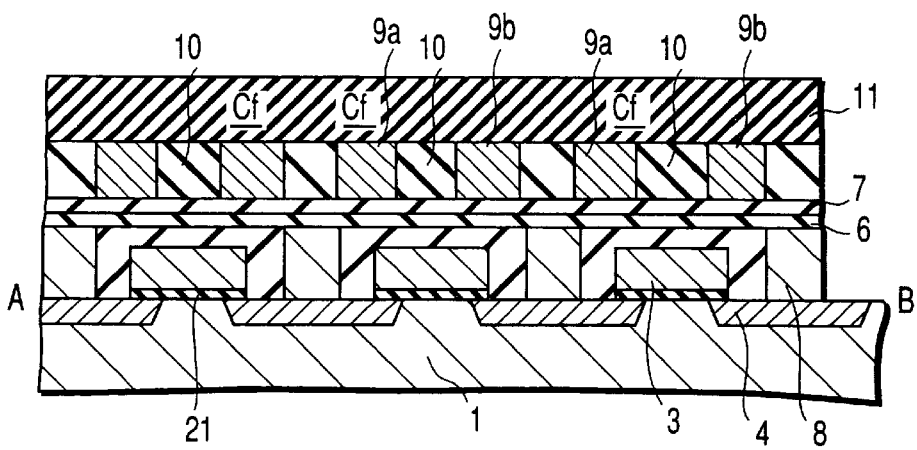

Then, as shown in FIG. 10B, a ferroelectric material for the ferroelectric film 10 is deposited all over the surface including the ferroelectric film-forming region 11a and a CMP method is performed until the surfaces of the capacitor electrodes 9a and 9b are exposed, and then an insulating film 11 is entirely possible to obtain a ferroelectric memory having excellent properties.

Figure 8A:
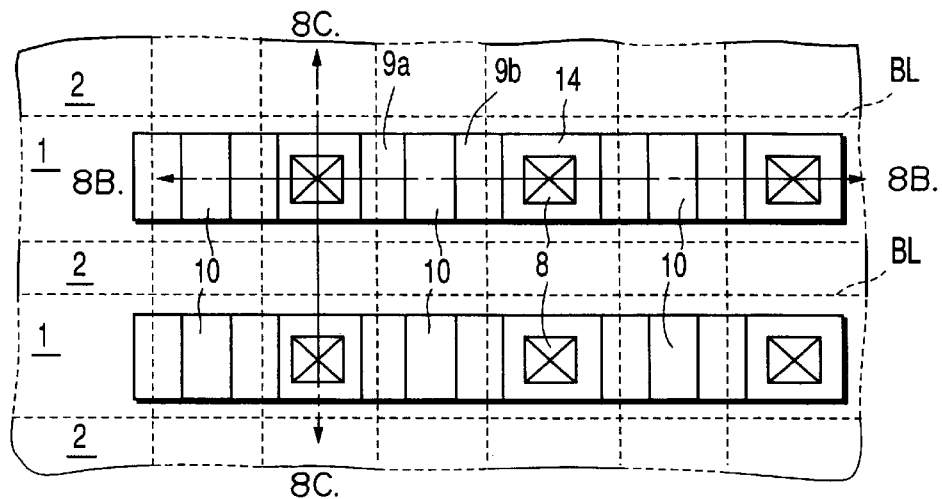
FIG. 8A shows a top plan view of a ferroelectric memory illustrating a third embodiment of this invention.
Figure 8B:
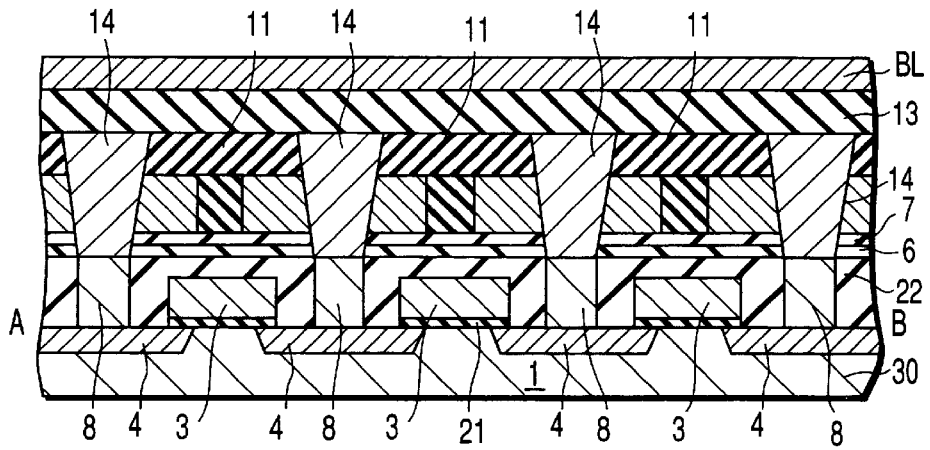
FIGS. 8B and 8C show respectively a cross-sectional view of the ferroelectric memory shown in FIG. 8A.
Figure 8C:
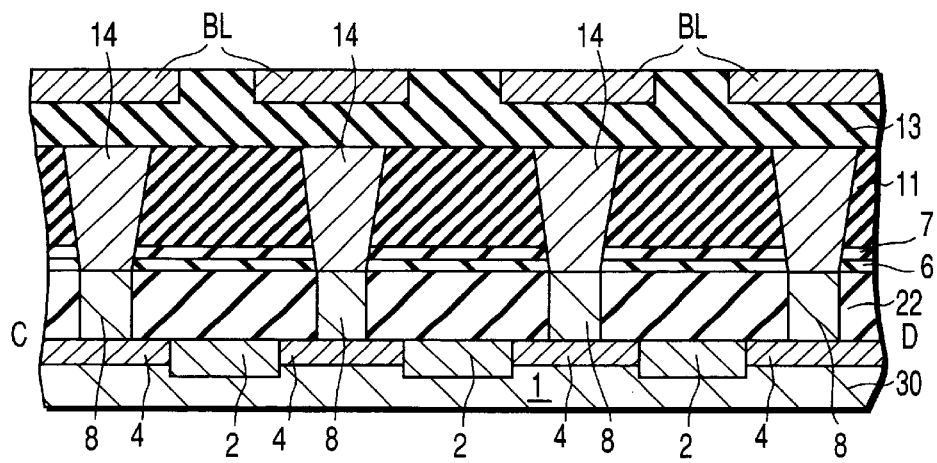

FIGS. 8A to 8C illustrate a third embodiment of this invention. This embodiment differs from the second embodiment shown in FIGS. 6A to 6C in that the metallic wiring 14 to be contacted with the contact plug 8 is tapered in such a manner that an upper portion thereof is wider and a lower portion thereof contacted with the contact plug 8 is almost identical in cross-sectional area with that of the contact plug 8.

Figure 9A:
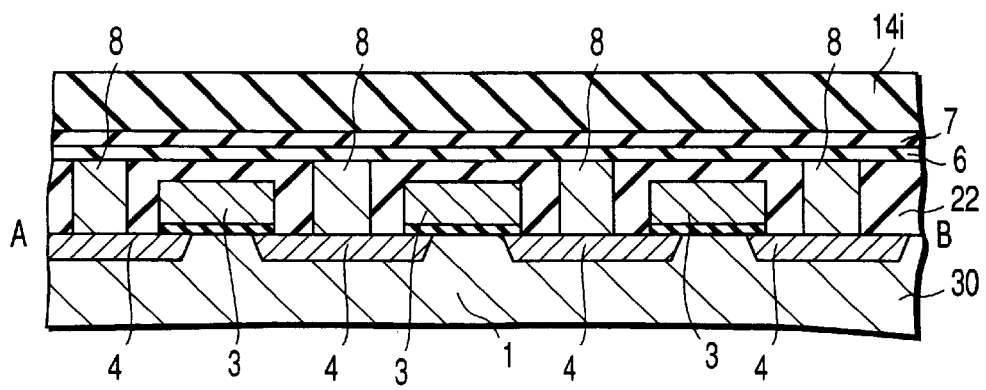
FIGS. 9A to 9C show respectively a cross-sectional view for illustrating the manufacturing method of the ferroelectric memory shown in FIGS. 8A to 8C.

Next, a method of forming this tapered metallic wiring 14 will be explained with reference to FIGS. 9A to 9C to FIGS. 11A to 11C. The step shown in FIG. 9A is identical with the step shown in FIG. 7A. The step shown in FIG. 9B corresponds to the step shown in FIG. 7B except that the barrier films 6 and 7 are formed therein, but differs from the step of FIG. 7B in the respect that according to FIG. 9B, an insulating film mask 14i having almost the same width as that of the contact plug 8 is formed therein.

Figure 9B:
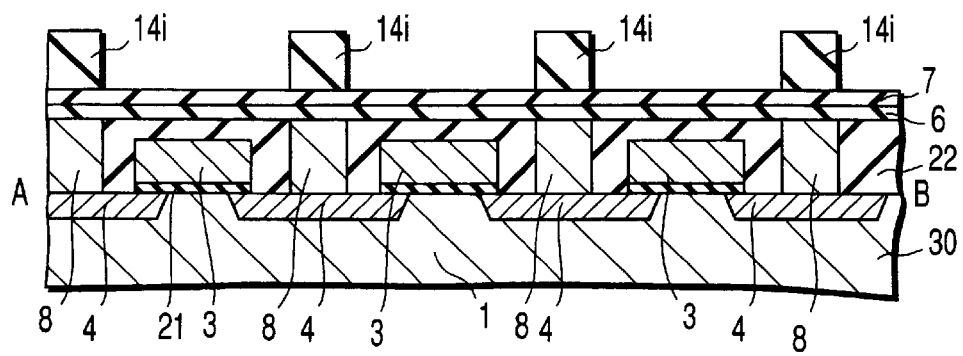
Figure 9C:
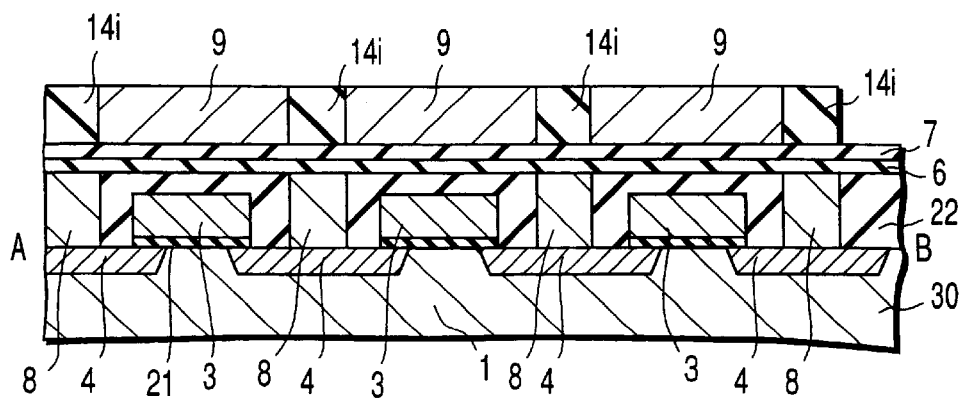

Thereafter, by way of the step shown in FIG. 9C which is identical with the step of FIG. 3C, an electrode film such as a plutinum film is deposited all over the surface including the insulating film mask 14i. The resultant electrode film is then heat-treated and flattened by means of a CMP method to thereby deposited. Thereafter, the surface of the insulating film 11 is flattened by means of the CMP method, thereby obtaining a ferroelectric capacitor Cf having the ferroelectric film 10 which is sandwiched between a pair of electrodes 9a and 9b.

Figure 10C:
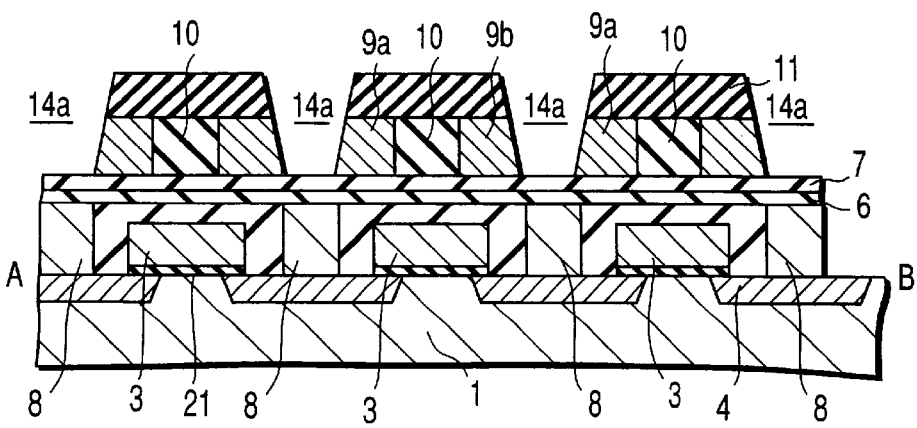

Then, as shown in FIG. 10C, the insulating films 14i and the side walls of the capacitor electrodes 9a and 9b that have been formed in advance are partially etched away together with the insulating film 11 to form an opening 14a having a tapered configuration or a cone-shaped configuration, thereby allowing the surfaces of the nitride film 7 as well as the capacitor electrodes 9a and 9b to expose from the bottom and side wall of the opening 14a. Subsequently, the resultant structure is subjected to an oxygen annealing at a temperature of 600° C. to 700° C. so as to sufficiently restore any damage to the ferroelectric film 10 that may be brought about up to this step. If both of the insulating films 11 and 14i are formed of the same insulating material, this etching can be accomplished using only one step.

Figure 11A:
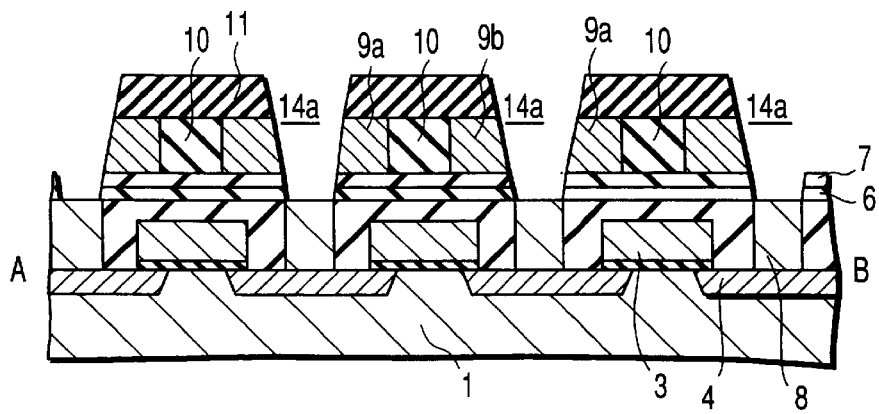
FIGS. 11A to 11C show respectively a cross-sectional view for illustrating the manufacturing method of the ferroelectric memory shown in FIGS. 8A to 8C.
Figure 11B:
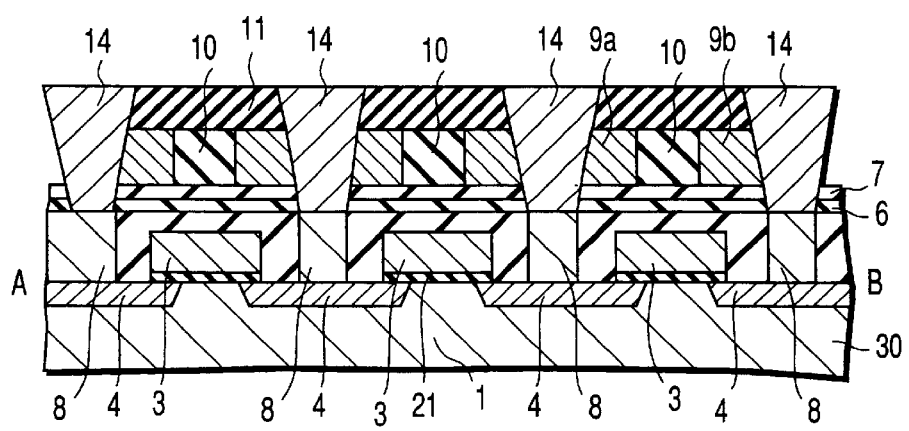

Then, as shown in FIG. 11A, the oxidative diffusion barrier film structure including the nitride film 7 and the oxide film 6 is etched away to thereby allow the surface of the contact plug 8 to expose. Thereafter, as shown in FIG. 11B, a conductive material for the metallic wiring 14 is entirely deposited, and the surface thereof is flattened by making use of a CMP method so as to make the resultant metallic wiring flush with the surface of the insulating film 11. It is possible in this case to further apply a heat treatment for effecting the reflow of the surface. In this way, the metallic wiring 14 can be left only at the opening portions 14a, and at the same time, the connection thereof with both electrodes 9a and 9b of the ferroelectric capacitor Cf as well as the connection thereof with the contact plugs 8 can be concurrently achieved.

Figure 11C:
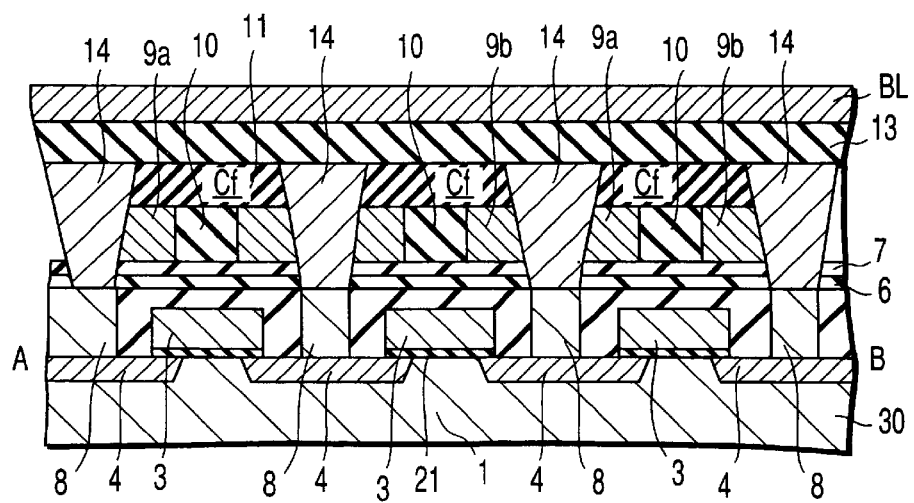

Finally, as shown in FIG. 11C, an insulating film 13 is entirely deposited, and the surface thereof is flattened by making use of a CMP method, after which a bit line BL is formed on the resultant surface. Although not shown in the drawings, an ordinary passivation film is entirely formed on the resultant surface, thereby finishing the manufacturing process of the ferroelectric memory. By undergoing these steps, it is possible to obtain a miniaturized series connected TC unit type ferroelectric RAM having a horizontal ferroelectric capacitor Cf.

In this third embodiment mentioned above, a top portion of each of the prutinum electrodes 9a and 9b of the ferroelectric capacitor Cf disposed on the sidewall of the opening 14a may be erased away on the occasion of etching the barrier films 6 and 7. The damage to the ferroelectric capacitor Cf which may be caused on this occasion can be minimized by suspending the etching immediately before the barrier films 6 and 7, and then, by the subsequent high-temperature annealing.

Figure 12A:
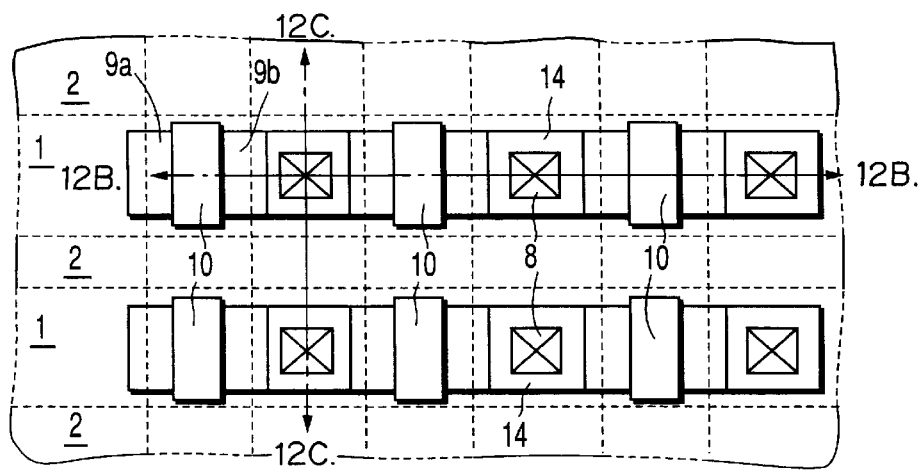
FIG. 12A shows a top plan view of a ferroelectric memory illustrating a fourth embodiment of this invention.
Figure 12B:
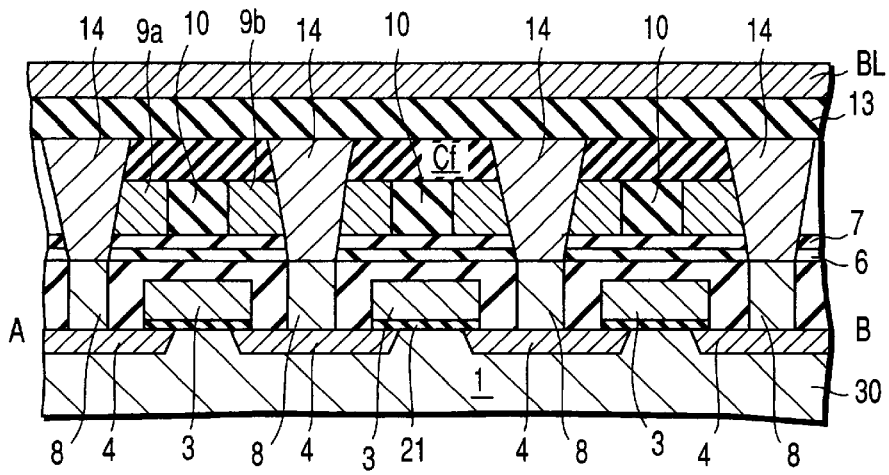
FIGS. 12B and 12C show respectively a cross-sectional view of the ferroelectric memory shown in FIG. 12A.
Figure 12C:
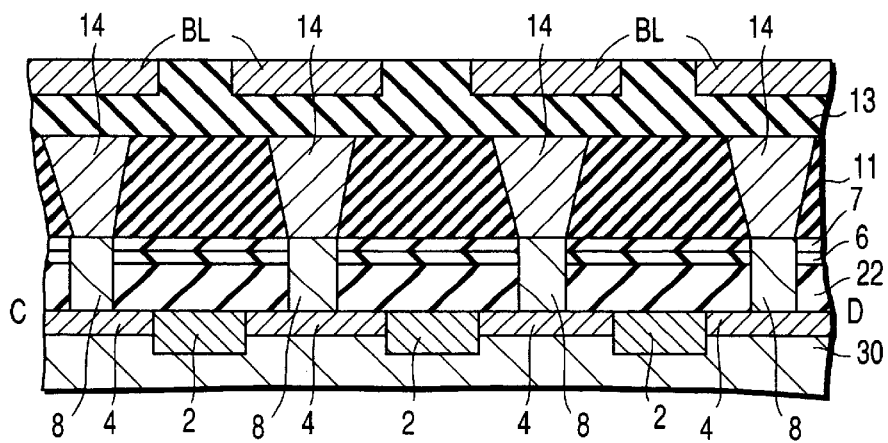

In the embodiment shown in FIGS. 12A to 12C, the ferroelectric film 10 is constructed in such a manner that side portions of the ferroelectric film 10 facing the element isolating regions 2 is formed not in a flush state relative to the corresponding portions of the right and left electrodes 9a and 9b, but is positively extended over the right and left electrodes 9a and 9b in the direction of the element isolating regions 2, thereby forming an off-set structure. As a result, these right and left electrodes 9a and 9b can be prevented from suffering from short-circuit, thereby making it possible to improve the manufacturing yield. It is required in this case to form the ferroelectric film 10 in such a manner that the both ends of the ferroelectric film 10 are at least in flush with or desirably, extended over these right and left electrodes 9a and 9b. Other constituents are all the same as those of the embodiment illustrated in FIGS. 8A to 8C, so that these same constituents will be represented by the same reference numerals, thereby omitting the explanation thereof.

Figure 13A:
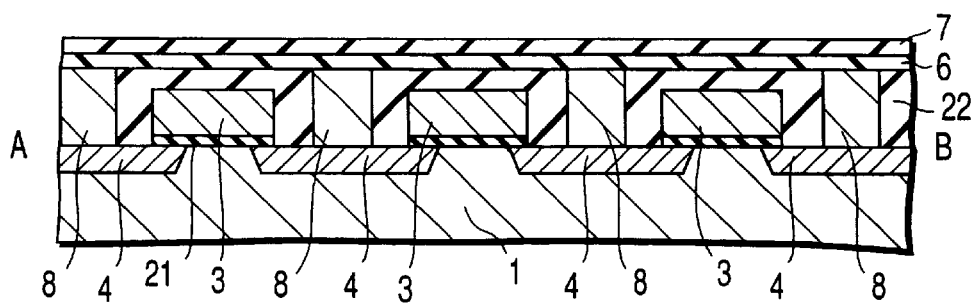
FIGS. 13A to 13C show respectively a cross-sectional view for illustrating the manufacturing method of the ferroelectric memory shown in FIGS. 12A to 12C.
Figure 13B:
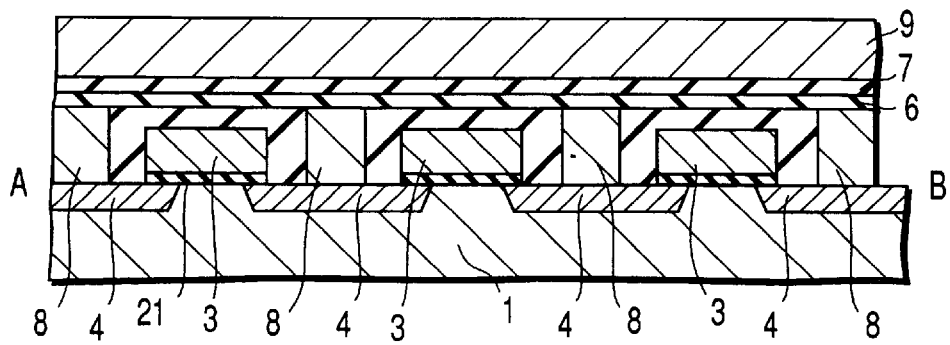
Figure 13C:
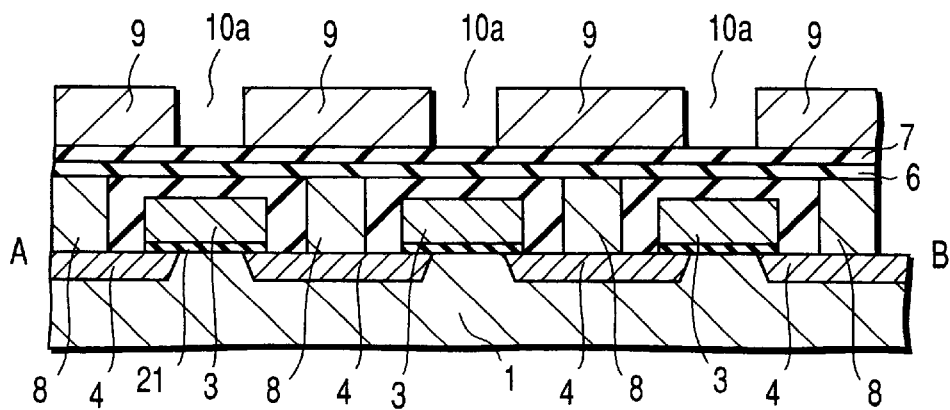

The embodiment shown in FIGS. 13A to 13C illustrates one example where the electrodes 9a and 9b of the ferroelectric capacitor Cf is crystallized on the plane of the nitride film 7.

The steps shown in FIGS. 13A to 13C correspond to the steps shown in FIGS. 7A to 7C or to the steps shown in FIGS. 9A to 9C, but differ from these latter steps in the respect that contact barrier films 6 and 7 are formed at first in place of the insulating film 14i, and then, a capacitor electrode film 9 is formed by means of a sputtering method or a coating method as shown in FIG. 13B.

Then, as shown in FIG. 13C, the capacitor electrode film 9 which is located in the region for forming the ferroelectric film 10 is etched away to form an opening 10a.

Figure 14A:
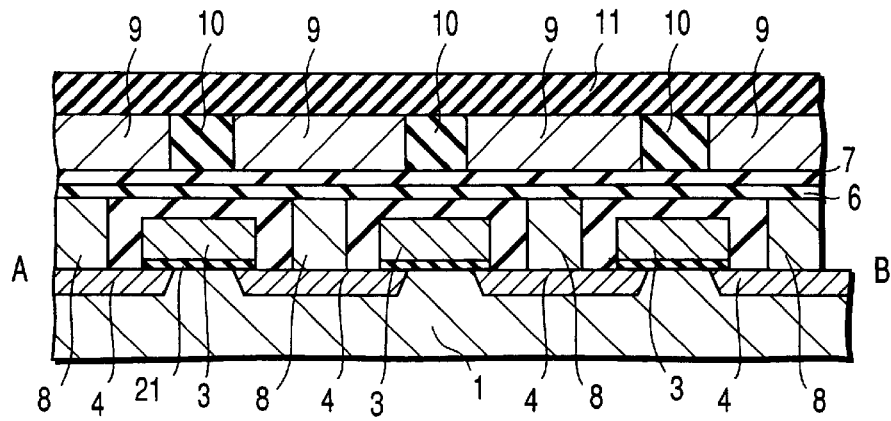
FIGS. 14A to 14C show respectively a cross-sectional view for illustrating the manufacturing method of the ferroelectric memory shown in FIGS. 12A to 12C.
Figure 14B:
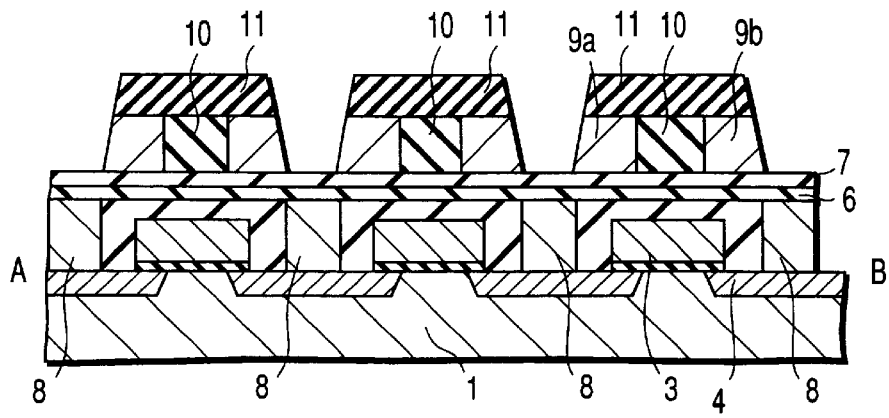

Thereafter, as shown in FIG. 14A, the ferroelectric film 10 is filled only in the opening 10a, and then, an insulating film 11 is deposited thereon. Then, as shown in FIG. 14B, the capacitor electrode film 9 and the insulating film 11, both disposed over the contact plug 8, are etched away. In this case also, the etching is temporarily suspended at the portions of contact barrier films 6 and 7.

Figure 14C:
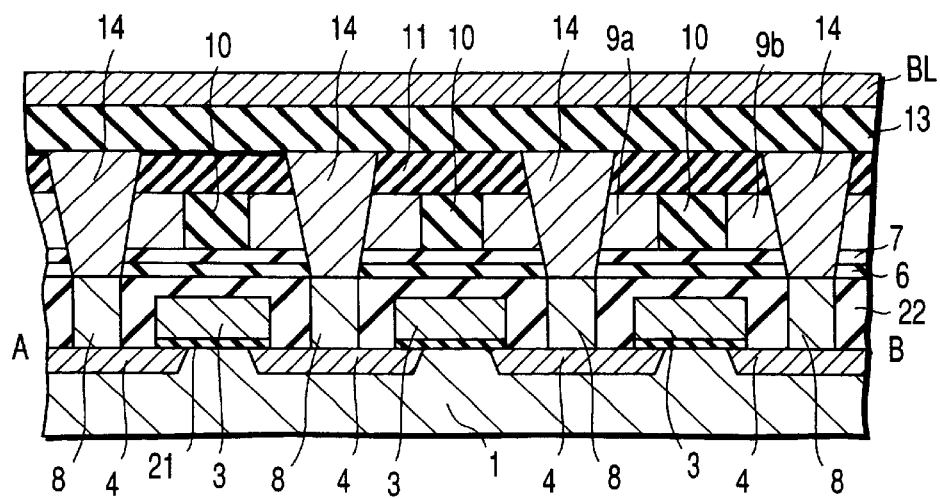

Subsequently, the annealing for restoring any damage induced by the working is performed for about one hour at a temperature of 700° C. These barrier films 6 and 7 are then entirely back-etched to thereby allow the contact plug 8 to expose, and then, a metallic wiring 14 is filled and buried therein to obtain a structure as shown in FIG. 14C. As for the material for this metallic wiring 14, it is preferable to employ a film containing aluminum (Al) or copper (Cu) as a main component and combined with a liner material including titanium (Ti) or niobium (Nb). The procedures to be performed thereafter are the same as those of the embodiment shown in FIGS. 8A to 8C.

Figure 15A:
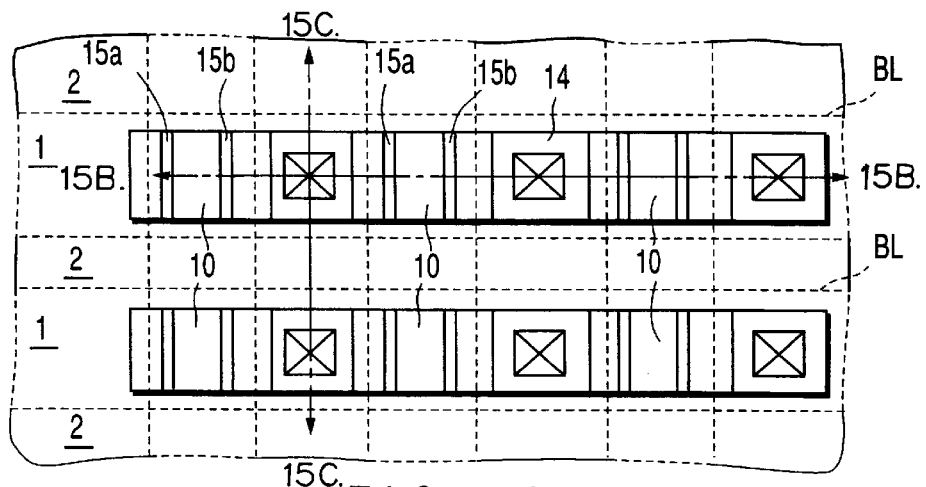
FIG. 15A shows a top plan view of a ferroelectric memory illustrating a fifth embodiment of this invention.
Figure 15B:
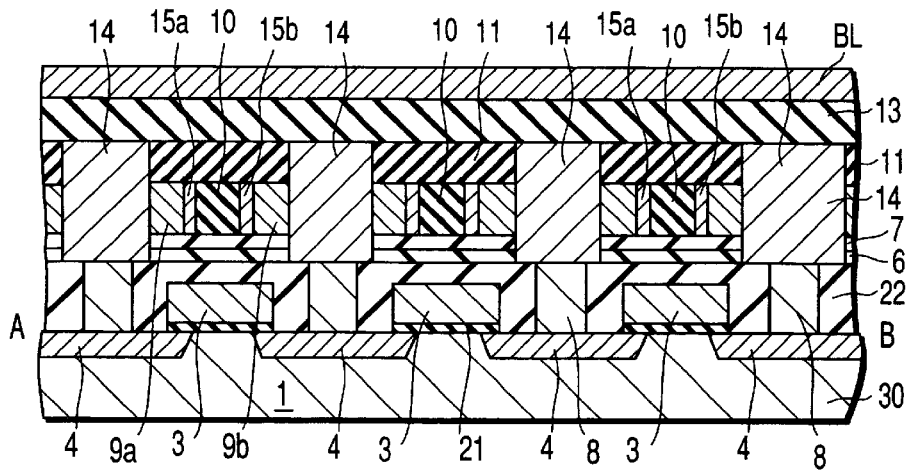
FIGS. 15B and 15C show respectively a cross-sectional view of the ferroelectric memory shown in FIG. 15A.
Figure 15C:
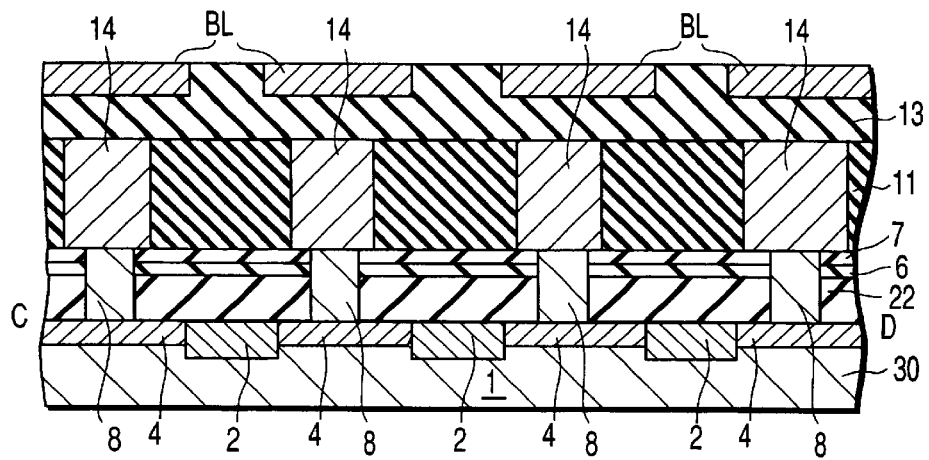

The structure of the embodiment shown in FIGS. 15A to 15C is almost the same as the embodiment shown in FIGS. 6A to 6C, but differs from that of the embodiment shown in FIGS. 6A to 6C in the respect that conductive oxide films 15a and 15b are formed on the sides of the ferroelectric film 10 as shown in FIGS. 15A and 15B. As for the conductive oxide films, it is possible to employ iridium oxide ($IrO_2$), rutenium oxide ($RuO_2$) or strontium oxide (SrO).

In the manufacture of the ferroelectric RAM according to this embodiment, electrodes 9 are formed at first, and an opening is formed at a central portion of each electrode 9 to leave a pair of electrodes 9a and 9b of the ferroelectric capacitor Cf. Thereafter, a conductive oxide film is deposited all over the surface including the aforementioned opening formed between the electrodes 9a and 9b. Then, an opening is formed at a central portion between the electrodes 9a and 9b of each capacitor element by means of a CMP method or an RIE method in such a manner that the sidewall film portions 15a and 15b formed of the conductive oxide films are left on both sidewalls of the opening. Then, a ferroelectric material for the ferroelectric film 10 is filled and buried in the opening to form the ferroelectric film 10. Other constituents are the same as those of the embodiment illustrated in FIGS. 6A to 6C.

Since a conductive oxide films 15a and 15b are disposed on the sidewall of the ferroelectric film 10 between the respective capacitor electrodes 9a and 9b, the fatigue characteristics of the ferroelectric capacitor Cf, i.e. the allowable number of data rewriting can be greatly improved, thereby making it possible to provide a ferroelectric RAM which is free from changes in data memory characteristics in a long-term use and is excellent in reliability.

FIGS. 16A to 16C and FIG. 17 illustrate a manufacturing process according to another embodiment of this invention, wherein the step shown in FIG. 16A is the same as that of FIG. 13A. Thereafter, as shown in FIG. 16B, an insulation film is formed and then, etched so as to selectively leave a dummy film 10*d* at the regions for forming the ferroelectric film 10. Subsequently, the deposition of platinum electrodes 9 and the CMP treatment are performed so as to accomplish the working of the platinum electrodes.

Then, as shown in FIG. 17, the dummy film 10*d* is replaced by the ferroelectric film 10. Specifically, the dummy film 10*d* is etched away to form an opening between the neighboring electrodes 9, into which the ferroelectric film 10 is filled and then, the resultant surface is flattened as required by the CMP method, for example. This step corresponds to the step shown in FIG. 14A. The subsequent steps to be followed are the same as those shown in FIGS. 14B and 14C.

Since it is possible according to this method to reduce the quantity of platinum electrode to be etched or the time required for the etching for forming the opening 10*a* for forming the ferroelectric film 10 as compared with the method of forming the opening 10*a* by etching the platinum film constituting the electrodes 9, the damage to the ferroelectric capacitor Cf during the etching of platinum can be minimized.

Moreover, since it is very difficult to vertically etch the platinum film, the sidewall of the opening 10*a* is caused to become tapered in order to secure a sufficient area at the bottom of the opening 10*a,* thereby inevitably increasing the area at the edge portion of the opening 10*a*. However, when the dummy film 10*d* which can be easily worked is employed, it becomes possible to form an opening having a normally vertical sidewall. Namely, since the opening 10*a* is free from a tapered sidewall and hence free from a pattern conversion difference, it is possible to obtain a further miniaturized cell.

Although the insulating film 11 is directly deposited in the step shown in FIG. 14A, the step of FIG. 17 may be followed, as shown in FIG. 18, by a step in which a composite barrier film 16 having the same structure as that of barrier films 6 and 7 is formed prior to the deposition of this insulating film 11, thereby making it possible to minimize the thinning of film of the electrode 9 in the etching step of the barrier films 6 and 7 which corresponds to the step of FIG. 14B where the etching is performed down to reach the contact plug 8.

In particular, since the top and bottom surfaces of the ferroelectric capacitor Cf can be covered by the diffusion barrier film except the portions thereof where the contact plugs 8 are located in this embodiment using this composite barrier film 16, the damage caused on the occasion of depositing the ferroelectric film 10 can be recovered in the so-called recovery/annealing step, and additionally, the resistivity to damage in the subsequent annealing step in a hydrogen gas atmosphere can be improved, thereby extremely improving the capacitor characteristics of the ferroelectric memory.

It is also possible in each of embodiments explained above to employ so-called LDD type structure as a structure for the diffusion layer 4 of the memory cell transistor. Further, a silicide layer may be formed on the surface of the diffusion layer 4 acting as a source or a drain or on the gate 3. If a silicide is to be employed, it is especially desirable to employ the diffusion barrier films 6 and 7 in view of the problems of heat resistance and oxidation resistance. Further, if the contact plug 8 is to be formed by depositing a polycrystalline silicon, it is necessary to take into consideration the concentration of impurities so as to make it possible to obtain a sufficiently low contact resistance.

These embodiments can be variously modified further within the spirit and scope of the present invention.

As explained above, according to this invention, since a ferroelectric capacitor is horizontally disposed instead of disposing it vertical as in the conventional structure, a pair of electrodes, facing to each other and corresponding to the upper and lower electrodes, of a ferroelectric capacitor which have been conventionally formed separately in the prior art can be simultaneously formed in a first or second wiring layer, for example, thereby making it possible to reduce the number of manufacturing steps. Furthermore, since a COT (Capacitor Over Transistor) structure is adopted in this invention instead of the COP structure, it is now possible to miniaturize the size of cell to an ultimate size of $4F^2$, thereby making it possible to obtain a ferroelectric capacitor exhibiting excellent properties and to further miniaturize the ferroelectric capacitor.

Additionally, when the entire surface of wafer is covered by an insulating oxidative diffusion barrier film such as an silicon nitride (SiN) film (a laminate structure of oxide film/nitride film) up to the step of forming a contact hole for exposing the contact plug, it becomes possible to secure a sufficient magnitude of margin or tolerance in the process design because of the fact that it is no longer necessary to employ a conductive barrier which is rather narrow in process margin particularly in the heating step as in the case of the prior art. Therefore, it is possible to perform a sufficient annealing step or a heating step for the purpose of sufficiently restoring the damage that may be brought about during the steps of forming or working a ferroelectric capacitor or during the formation of an insulating film. Thus, it is possible to ensure the excellent properties of the ferroelectric capacitor. For example, since such a high barrier property that is capable of withstanding the temperature of 700° C. or so, this invention can be applied to the SBT which is indispensable for obtaining a film of high temperature resistance and exhibiting excellent properties.

As for the manufacturing process according to this invention, it is possible to make uniform the structure of films including that of memory cell and those of other components located other than the memory cell in making contact with the contact plug, thereby simplifying the process. Further, a pair of facing electrodes of the ferroelectric capacitor can be simultaneously formed, and hence, even if platinum is employed as an electrode material, the time to etch the platinum can be shortened, thereby making it possible to minimize any damage to the ferroelectric capacitor, which may be induced during the working of the ferroelectric capacitor.

In the foregoing embodiments, platinum is employed as an electrode material of the capacitor electrodes 9*a* and 9*b*. However, the capacitor electrodes 9*a,* 9*b* may be formed at least of a single substance film of a material selected from a group consisting of Pt, Ir, $IrO_2$, Ru, $RuO_2$, and $SrO_2$; and of a multi-layered film comprising two or more materials of the single substrate film.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A ferroelectric memory comprising:

an MOS transistor including first and second source/drain regions formed on a semiconductor substrate;

a ferroelectric capacitor containing first and second electrodes horizontally disposed over said MOS transistor in such a manner that a line connecting said first and second electrodes of said ferroelectric capacitor is directed along a channel of said MOS transistor formed between said first and second source/drain regions;

first, second, and third contact plugs, said first contact plug being connected with a gate of said MOS transistor and said second and third contact plugs being connected with said first and second source/drain regions of said MOS transistor, respectively; and first and second metallic wirings respectively formed on said second and third contact plugs which are connected with said first and second source/drain regions, said first and second metallic wirings respectively having side-walls which are contacted with the first and second electrodes of said ferroelectric capacitor, respectively.

2. The ferroelectric memory according claim 1, wherein a barrier film is formed between said MOS transistor and said capacitor.

3. The ferroelectric memory according to claim 2, wherein said barrier film is formed of at least one of a silicon nitride film and a silicon oxynitride film, and said barrier film is formed at a contact region connecting the electrode of said capacitor with said contact plug.

4. The ferroelectric memory according to claim 2, wherein a width of an opening of a contact for burying said metallic wiring formed on said contact plug connected with the source/drain regions of said MOS transistor is made larger than that of said contact plug and is made identical with or smaller than that of said contact plug at a connecting portion thereof with said contact plug.

5. The ferroelectric memory according to claim 2, wherein the electrodes of said ferroelectric capacitor disposed horizontally is formed at least of a single substance film of a material selected from a group consisting of Pt, Ir, $IrO_2$, Ru, $RuO_2$ and SrO; and of a multi-layer film comprising two or more materials of said single substance film.

6. The ferroelectric memory according to claim 2, wherein said capacitor has opposite ends which are at least extended externally from those of the electrodes disposed on both sides of said capacitor.

7. The ferroelectric memory according to claim 2, wherein said metallic wiring is formed of a wiring containing, as main components, a barrier metal and one of Al and Cu.

8. The ferroelectric memory according to claim 7, wherein said barrier metal comprises a nitride of Ti or Nb.

9. The ferroelectric memory according to claim 1, wherein said contact plug contains W as a main component.

10. The ferroelectric memory according to claim 1, wherein said contact plug contains silicon or a silicide as a main component, or is formed of a laminated body containing silicon and a silicide.

11. A ferroelectric memory according to claim 1, wherein the electrodes of said ferroelectric capacitor horizontally disposed is formed at least of a single substance film of a material selected from a group consisting of Pt, Ir, $IrO_2$, Ru, $RuO_2$ and SrO; and of a multi-layer film comprising two or more materials of said single substance film.

12. A ferroelectric memory comprising:

an MOS transistor including first and second source/drain regions formed on a semiconductor substrate;

an interlayer insulating film formed covering said MOS transistor;

a capacitor containing first and second electrodes horizontally disposed over said MOS transistor in such a manner that a line connecting said first and second electrodes of said capacitor is directed along a channel direction of said MOS transistor formed between said first and second source/drain regions;

first, second, and third contact plugs buried in said interlayer insulating film, said first contact plug being connected at one end with a gate of said MOS transistor and said second and third contact plugs being connected at one end with said source/drain regions of said MOS transistor, respectively, and exposed at the other end from a surface of said interlayer insulating film; and first and second metallic wirings respectively connected with said second and third contact plugs which are connected with said first and second source/drain regions, said first and second metallic wirings respectively having side-walls contacted with the first and second electrodes of said capacitor, respectively.

13. The ferroelectric memory according claim 12, wherein a barrier film is formed between said MOS transistor and said capacitor.

14. The ferroelectric memory according to claim 13, wherein said barrier film is formed of at least one of a silicon nitride film and a silicon oxynitride film, and said barrier film is formed at a contact region connecting the electrode of said capacitor with said contact plug.

15. The ferroelectric memory according to claim 12, wherein said contact plug contains W as a main component.

16. The ferroelectric memory according to claim 12, wherein said contact plug contains silicon or a silicide as a main component, or is formed of a laminated body containing silicon and a silicide.

17. A ferroelectric memory according to claim 12, wherein the electrodes of said capacitor horizontally disposed is formed at least of a single substance film of a material selected from a group consisting of Pt, Ir, $IrO_2$, Ru, $RuO_2$ and SrO; and of a multi-layer film comprising two or more materials of said single substance film.

18. A ferroelectric memory comprising:

a plurality of diffusion regions in order formed on a surface of a semiconductor substrate;

a plurality of gate electrodes each formed via a gate insulating film on a surface portion of said semiconductor substrate at a position located between respective two neighboring diffusion regions of said plurality of diffusion regions to form a plurality of MOS transistors together with said respective two neighboring diffusion regions;

a plurality of ferroelectric capacitors each containing first and second electrodes horizontally disposed over of said MOS transistors;

contact plugs including first contact plugs connected with gates of said MOS transistors and second contact plugs connected with said diffusion regions acting as source/drain region of said MOS transistors, respectively; and a plurality of metallic wirings each connected with said second contact plugs, and one of two neighboring metallic wirings having one side-wall connected to the first electrode of each of said capacitors and the other of two neighboring metallic wirings having one side-wall connected to the second electrode of each of said capacitors.

19. The ferroelectric memory according claim 18, wherein a barrier film is formed between said MOS transistor and said capacitor.

20. The ferroelectric memory according to claim 19, wherein said barrier film is formed of at least one of a silicon nitride film and a silicon oxynitride film, and said barrier film is formed at a contact region connecting the electrode of said capacitor with said contact plug.

21. The ferroelectric memory according to claim 18, wherein said contact plug contains W as a main component.

22. The ferroelectric memory according to claim 18, wherein said contact plug contains silicon or a silicide as a main component, or is formed of a laminated body containing silicon and a silicide.

23. A ferroelectric memory according to claim 18, wherein the electrodes are formed at least of a single substance film of a material selected from a group consisting of Pt, Ir, $IrO_2$, Ru, $RuO_2$ and SrO; and of a multi-layer film comprising two or more materials of said single substance film.

24. A ferroelectric memory comprising:
   a plurality of diffusion regions successively formed on a surface of a semiconductor substrate,
   a plurality of gate electrodes each formed via a gate insulating film on a surface portion of said semiconductor substrate between neighboring regions of said diffusion regions to form a plurality of MOS transistors together with said plurality of diffusion regions;
   an interlayer insulating film formed covering said MOS transistors and having a plane surface;
   a plurality of ferroelectric capacitors each containing first and second electrodes horizontally disposed over said MOS transistors formed on a surface of said semiconductor substrate along a direction of a channel length of said MOS transistors;
   contact plugs buried in said interlayer insulating film and connected at one end with gates of said MOS transistors and with the diffusion regions acting as source/drain regions of said MOS transistors, respectively, and exposed at the other end from the surface of said interlayer insulating film; and
   a plurality of metallic wirings each being contacted with said contact plugs connected with the diffusion regions acting as said source/drain regions, and one of two neighboring metallic wirings being connected with said first electrode of a ferroelectric capacitor and the other of two neighboring metallic wirings being connected with said second electrode of said ferroelectric capacitor.

25. The ferroelectric memory according claim 24, wherein a barrier film is formed between said MOS transistor and said capacitor.

26. The ferroelectric memory according to claim 25, wherein said barrier film is formed of at least one of a silicon nitride film and a silicon oxynitride film, and said barrier film is formed at a contact region connecting the electrode of said capacitor with said contact plug.

27. The ferroelectric memory according to claim 24, wherein said contact plug contains W as a main component.

28. The ferroelectric memory according to claim 24, wherein said contact plug contains silicon or a silicide as a main component, or is formed of a laminated body containing silicon and a silicide.

29. A ferroelectric memory according to claim 24, wherein the electrodes are formed at least of a single substance film of a material selected from a group consisting of Pt, Ir, $IrO_2$, Ru, $RuO_2$ and SrO; and of a multi-layer film comprising two or more materials of said single substance film.

* * * * *